United States Patent [19]

Tanaka et al.

[11] Patent Number: 5,663,673

[45] Date of Patent: Sep. 2, 1997

[54] OUTPUT CIRCUIT HAVING AT LEAST ONE EXTERNAL TRANSISTOR

[75] Inventors: Hirokazu Tanaka; Tatsuo Kumano; Tetsuji Funaki; Takahiro Watai, all of Kawasaki, Japan

[73] Assignee: Fujitsu Limited, Kawasaki, Japan

[21] Appl. No.: 413,947

[22] Filed: Mar. 30, 1995

[30] Foreign Application Priority Data

Jun. 30, 1994 [JP] Japan .................. 6-149361
Feb. 28, 1995 [JP] Japan .................. 7-040406

[51] Int. Cl.⁶ ........................... H03F 3/26; H03K 17/16
[52] U.S. Cl. ...................... 327/412; 327/317; 327/318; 327/563; 327/575; 330/255; 330/267
[58] Field of Search ......................... 327/575, 112, 327/317, 409, 410, 313, 325, 483, 484, 108, 320, 488, 412, 318, 560, 563; 330/267, 268, 263, 255

[56] References Cited

U.S. PATENT DOCUMENTS

| | | | |
|---|---|---|---|
| 3,886,465 | 5/1975 | Mattfeld | 330/267 |
| 3,955,149 | 5/1976 | Trilling | 330/30 D |
| 4,077,013 | 2/1978 | Morez et al. | 330/268 |
| 4,510,458 | 4/1985 | Sato et al. | 330/260 |
| 4,672,326 | 6/1987 | Cini et al. | 330/254 |
| 4,752,745 | 6/1988 | Pass | 330/267 |
| 4,912,425 | 3/1990 | Kobayashi | 330/253 |
| 4,912,429 | 3/1990 | Takato et al. | 330/261 |
| 5,162,749 | 11/1992 | Kobayashi | 330/253 |
| 5,218,320 | 6/1993 | Albouy et al. | 330/259 |

FOREIGN PATENT DOCUMENTS

| | | |
|---|---|---|
| 0 275 079 A2 | 7/1988 | European Pat. Off. . |
| 0 525 656 A1 | 2/1993 | European Pat. Off. . |
| 0 620 638 A2 | 10/1994 | European Pat. Off. . |
| 2 577 083 | 8/1986 | France . |
| 1399899 | 7/1975 | Japan .................. 330/267 |
| 55-11640 | 1/1980 | Japan .................. 330/267 |
| 56-28509 | 3/1981 | Japan .................. 330/268 |
| 57-80813 | 5/1982 | Japan .................. 330/268 |
| 86160603 | 5/1986 | Netherlands ................. 330/267 |

Primary Examiner—Timothy P. Callahan
Assistant Examiner—Terry L. Englund
Attorney, Agent, or Firm—Nikaido, Marmelstein, Murray & Oram LLP

[57] ABSTRACT

An output circuit, for minimizing output idle current fluctuations and improve the output voltage range, has first and second transistors connected to first and second power sources, with a plurality of diodes connected to control terminals of the first and second transistors. The output circuit further includes a third transistor having a first terminal connected to the second power source and a second terminal connected to a predetermined position among the plurality of diodes. A predetermined voltage is applied from the diodes to the control terminal of the first transistor when the third transistor is saturated, to bring a level of an output of said output circuit close to a level of the second power source. A fourth transistor, a fifth transistor, a first resistor, and a capacitor are also provided. The forth transistor has a control terminal connected to an output of a differential circuit, and a first terminal connected to the second power source through the first resistor as well as to the control terminals of the third and fifth transistors. A second terminal is connected to the first power source, with the fifth transistor having a first terminal connected to the second power source and a second terminal connected to the control terminal of the second transistor. The capacitor is connected between the control terminal of the fourth transistor and the second terminal of the fifth transistor. This output circuit also limits the output voltage without changing the impedance of the high-impedance input.

21 Claims, 24 Drawing Sheets

OUTPUT CIRCUIT HAVING AT LEAST ONE EXTERNAL TRANSISTOR

BACKGROUND OF THE INVENTION

1. Field of the Invention

The present invention relates to an output circuit, and more particularly, to an output circuit with external transistors.

2. Description of the Related Art

A subscriber line interface circuit (SLIC) of an exchange employs a power supply circuit. The power supply circuit has an output circuit for handling a large amount of power. When integrating the output circuit, power consumed by the output circuit, i.e., an output drive circuit or output transistors, cannot be ignored. The integrated output circuit needs a package of low heat resistance that may increase cost and size. In particular, a high-function LSI with many pins will be very expensive if it must employ such a special package because of the output circuit thereof.

Integrating an output circuit into an LSI or IC may be advantageous to reduce the number of parts. Employing a small number of external parts, however, does not hinder the compactness of a semiconductor product owing to an improvement in an SMD technique. Accordingly, it is sometimes advantageous to employ an output circuit with external transistors if requirements on power, voltage, and current allow. In this case, the important thing is to secure the performance of the output circuit with external transistors. The problems of the prior art will be explained in detail with reference to accompanying drawings.

SUMMARY OF THE INVENTION

An object of the present invention is to provide an output circuit with external output transistors, capable of minimizing a fluctuation in an output idle current and improving the range of output voltages when a load current flows. Another object of the present invention is to provide an operational amplifier capable of limiting an output voltage without influencing the input thereto, i.e., without changing the impedance of the high-impedance input.

According to the present invention, there is provided an output circuit having first and second transistors arranged between first and second power source units, at least one of the first and second transistors being an external transistor, wherein the output circuit comprises a resistor unit and a diode unit connected, in parallel, between a first terminal of the first transistor and a first terminal of the second transistor.

The first and second transistors may constitute a push-pull circuit, the resistor unit may stabilize an output idle current flowing through one of the first and second transistors, and the diode unit may clamp a voltage drop caused by the resistor unit.

The output circuit may further comprise a differential circuit to receive an input and an inverted input. The output circuit may further comprise a third transistor and a capacitor unit; the third transistor having a control terminal to receive an output of the differential circuit, a first terminal connected to the second power source unit, and a second terminal connected to a control terminal of the second transistor; and the capacitor unit being connected between the control and second terminals of the third transistor.

The output circuit may include a bias diode unit arranged between a control terminal of the first transistor and the control terminal of the second transistor, the control terminal of the first transistor being connected to the first power source unit through a current source. The bias diode unit may comprise first and second diodes connected in series. The bias diode unit may comprise a plurality of transistors forming a Darlington circuit. At least one of the first and second transistors may comprise a plurality of output transistors forming a Darlington circuit, and the number of the bias diode units may be determined in accordance with an arrangement of the output transistors. The first transistor may be an npn-type bipolar transistor, the second transistor may be a pnp-type bipolar transistor, and the first terminal of each of the first and second transistors may be an emitter.

The resistance of the resistor unit may be several hundreds of ohms or greater. The output circuit may be applied to a power supply circuit of a subscriber line interface circuit of an exchange.

Further, according to the present invention, there is provided an output circuit having first and second transistors arranged between first and second power source units and a plurality of diode units arranged between a control terminal of the first transistor and a control terminal of the second transistor, wherein the output circuit comprises a third transistor having a first terminal connected to the second power source unit and a second terminal connected to a predetermined position among the diode units, a predetermined voltage being applied to the control terminal of the first transistor when the third transistor is saturated, to bring a level of an output close to a level of the second power source unit.

The output circuit may further comprise a differential circuit to receive an input and an inverted input. The output circuit may further comprise a fourth transistor, a fifth transistor, a first resistor unit, and a capacitor unit, the fourth transistor having a control terminal connected to an output of the differential circuit, a first terminal connected to the second power source unit through the first resistor unit as well as to the control terminals of the third and fifth transistors, and a second terminal connected to the first power source unit, the fifth transistor having a first terminal connected to the second power source unit and a second terminal connected to the control terminal of the second transistor, the capacitor unit being connected between the control terminal of the fourth transistor and the second terminal of the fifth transistor.

The output circuit may further comprise a stabilizing diode unit arranged between the second terminals of the fifth and third transistors, so that a potential of the second terminal of the third transistor is not brought to be too low with respect to the potential of the second terminal of the fifth transistor. The stabilizing diode unit may be a diode having an anode connected to the second terminal of the third transistor and a cathode connected to the second terminal of the fifth transistor.

The output circuit may further comprise a second resistor unit inserted between a node between the first terminal of the fourth transistor and the first resistor unit and the control terminal of the fifth transistor. The output circuit may further comprise a third resistor unit inserted between a node between the first terminal of the fourth transistor and the first resistor unit and the control terminal of the third transistor.

The diode unit may comprise first and second diodes connected in series, and the second terminal of the third transistor may be connected to a node between the first and second diodes. The diode unit may comprise transistors forming a Darlington circuit. At least one of the first and second transistors may comprise a plurality of output transistors forming a Darlington circuit, and the number of the diode units may be determined in accordance with an arrangement of the output transistors.

The first transistor maybe an npn-type bipolar transistor, the second transistor may be a pnp-type bipolar transistor, and the first terminal of each of the first and second transistors may be an emitter. The output circuit may be applied to a power supply circuit of a subscriber line interface circuit of an exchange.

In addition, according to the present invention, there is provided a semiconductor integrated circuit device having the above described output circuit or an exchange having a subscriber line interface circuit including the above described output circuit.

According to the present invention, there is provided an operational amplifier comprising a comparator unit for comparing an output voltage with a reference voltage, an output of the comparator unit being fed back as an input to an output section without influencing an input, to limit the output voltage.

Further, according to the present invention, there is provided an operational amplifier comprising a comparator unit for comparing an output voltage with a reference voltage, an output of the comparator unit being fed back as an input to an intermediate section without influencing an input, to limit the output voltage.

According to the present invention, there is also provided an operational amplifier having a plurality of intermediate sections, comprising a comparator unit for comparing an output voltage with a reference voltage, an output of the comparator unit being fed back as an input to an output section without influencing an input, to limit the output voltage.

Further, according to the present invention, there is also provided an operational amplifier having a plurality of intermediate sections, comprising a comparator unit for comparing an output voltage with a reference voltage, an output of the comparator unit being fed back as an input to any one of the intermediate sections without influencing an input, to limit the output voltage.

The operational amplifier may further comprise a plurality of reference voltages and a plurality of comparator units. The current source may be controllable to determine whether or not the output voltage must be limited. The operational amplifier may further comprise a plurality of current sources that are independently controllable to selectively limit the output voltage. A feedback current to be supplied when a differential pair of the comparator unit is balanced with each other may be substantially equal to a bias current at a controlled point in the operational amplifier.

The operational amplifier may be applied to a power supply circuit of a subscriber line interface circuit of an exchange. In addition, according to the present invention, there is provided a semiconductor integrated circuit device having the above described operational amplifier or an exchange having a subscriber line interface circuit employing a controller comprising the above described operational amplifier.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the prior arts will be explained.

A subscriber line interface circuit (SLIC) of an exchange employs a power supply circuit. The power supply circuit has an output circuit for handling power. When integrating the output circuit, power consumed by the output circuit, i.e., an output drive circuit or output transistors, cannot be ignored. The integrated output circuit needs a package of low heat resistance 20 that may increase cost and size. In particular, a high-function LSI with many pins will be very expensive if it must employ such a special package for only the output circuit thereof.

Integrating an output circuit into an LSI or IC may be advantageous to reduce the number of parts. Employing a small number of external parts, however, does not hinder the compactness of a semiconductor product owing to an improvement in an SMD technique. Accordingly, it is sometimes advantageous to employ an output circuit with external transistors if the power, voltage, and current requirements allow. In this case, the important thing is to secure the performance of the output circuit with external transistors.

Figure 14:
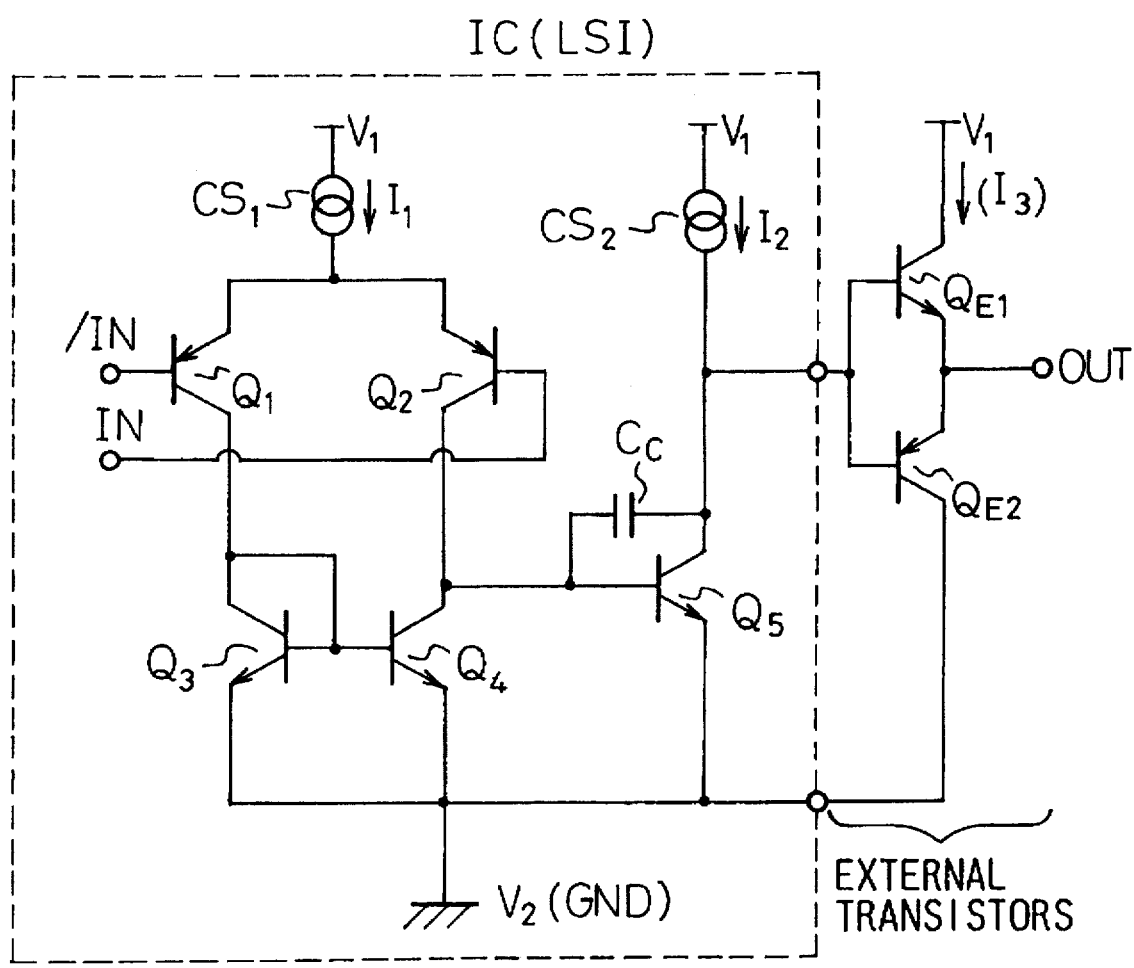
FIG. 14 shows an output circuit according to a prior art corresponding to the first aspect of the present invention.

FIG. 14 shows an output circuit according to a prior art corresponding to the first aspect of the present invention. The output circuit employs pnp-type bipolar transistors Q1, Q2, and QE2, npn-type bipolar transistors Q3, Q4, Q5, and QE1, current sources CS1 and CS2, and a capacitor Cc. The output circuit includes a high-potential power source V1 and a low-potential power source V2, i.e., a ground GND.

The transistors Q1, Q2, Q3, and Q4 and power source CS1 form a differential circuit, which receives an input IN and an inverted input /IN and provides an output to the base of the transistor Q5. The capacitor Cc is a phase compensation capacitor connected between the base and collector of the transistor Q5. The collector of the transistor Q5 is connected to the high-potential power source V1 through the current source CS2 as well as to the bases of the transistors QE1 and QE2. The emitter of the transistor Q5 is connected to the low-potential power source V2.

The transistors QE1 and QE2 are external to an IC (LSI) and form an output section. The collector of the transistor QE1 is connected to the high-potential power source V1, and the collector of the transistor QE2 is connected to the low-potential power source V2. The emitters of the transistors QE1 and QE2 are connected together to provide an output OUT. The external transistors QE1 and QE2 form a push-pull circuit.

When there is no output load, the output section passes no current. Namely, the idle current I3 is zero. This is advantageous in reducing power consumption. This circuit, however, causes a crossover distortion when the direction of an output current changes. To reduce the crossover distortion, the output circuit of FIG. 15, according to another prior art, has been proposed.

Figure 15:
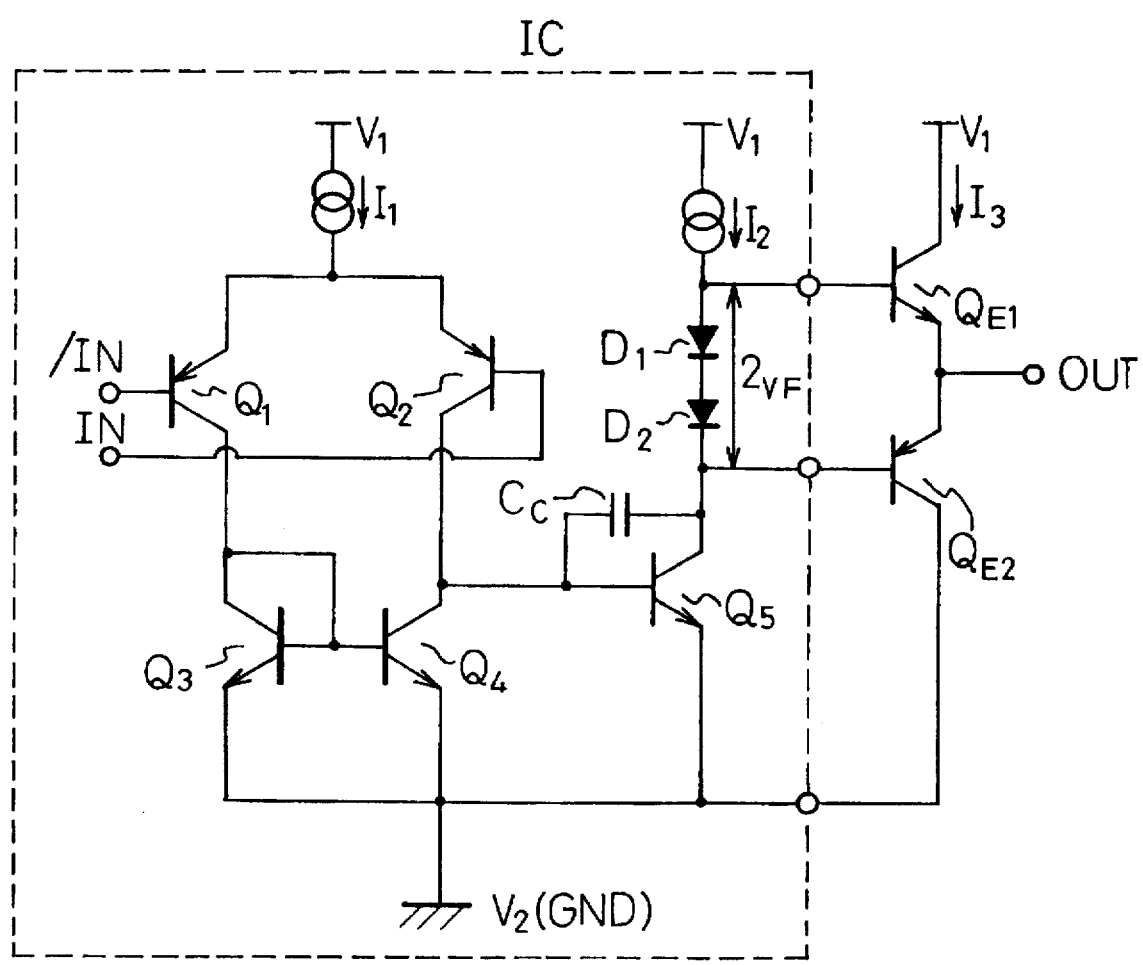
FIG. 15 shows an output circuit according to another prior art corresponding to the first aspect of the present invention.

The prior art of FIG. 15 corresponds to the first aspect of the present invention. In this prior art, series-connected diodes D1 and D2 are arranged between the bases of the external transistors QE1 and QE2 instead of the bases of these transistors being connected together. The diodes D1 and D2 are used to bias the transistors QE1 and QE2.

When a current I2 passes through the diodes D1 and D2, a forward voltage of 2VF is generated between the bases of the transistors QE1 and QE2, to determine an idle current I3 passing through the output section. The idle current I3 corrects the crossover distortion.

If the transistors QE1 and QE2 are incorporated in an IC, the relationship between the diodes D1 and D2 and the transistors QE1 and QE2 will be fixed, so that the idle current I3 will be fixed with respect to the current I2 passing through the diodes D1 and D2. If the transistors QE1 and QE2 are external to the IC, the idle current I3 will fluctuate due to fluctuations in the characteristics of the transistors. Namely, when the transistors QE1 and QE2 are external, manufacturing variations in the characteristics of the IC influences the idle current I3. Compared with fluctuations in currents I1 and I2, a fluctuation in the idle current I3 cannot be ignored in connection with power consumption.

To reduce a fluctuation in the idle current I3, a resistor may be connected in series with the emitters of the transistors QE1 and QE2. If the resistance of this resistor is small, for example, several tens of ohms, it is insufficient to stabilize the idle current I3, and if the resistance is large for example, several hundreds of ohms, it is impractical because the voltage drop across the resistor due to an output load current narrows the range of output voltages.

Now, output circuits according to embodiments of the present invention will be explained with reference to the drawings.

Figure 1:
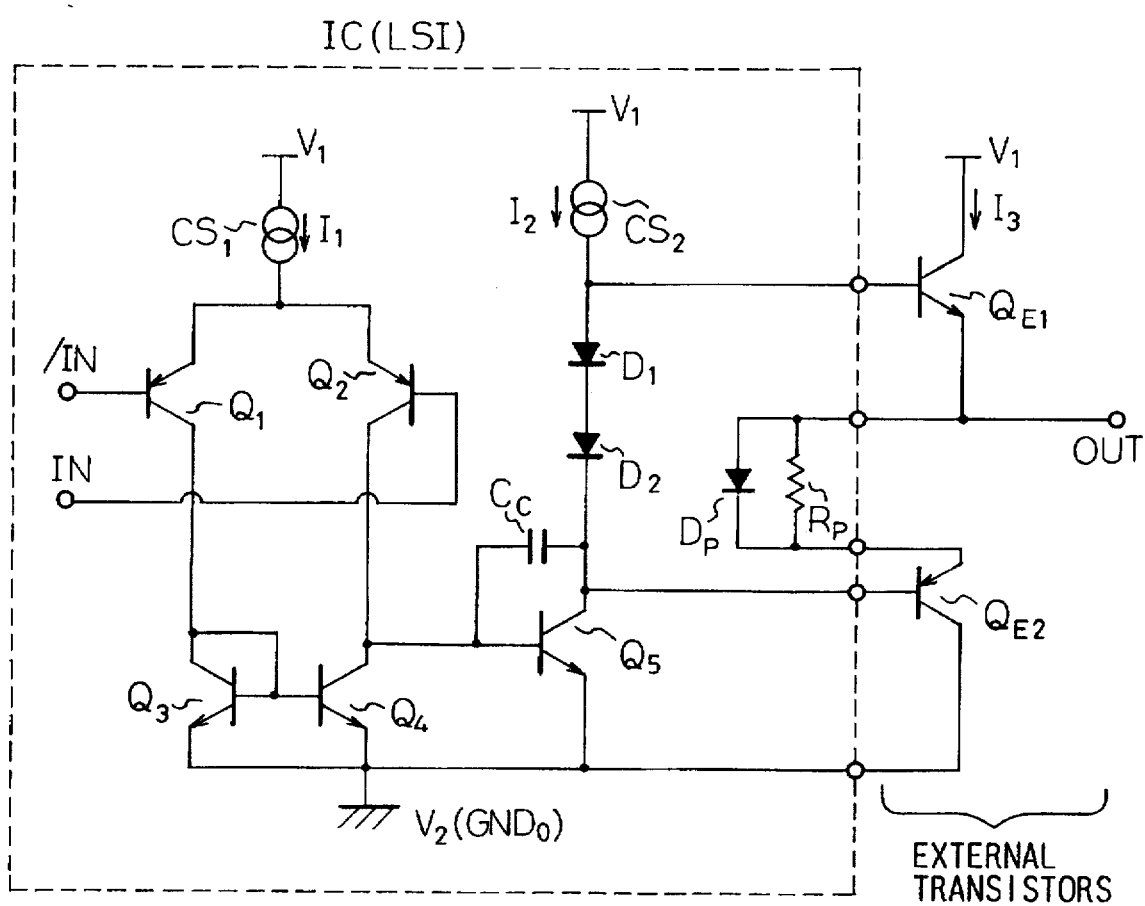
FIG. 1 shows an output circuit according to a first embodiment of a first aspect of the present invention.

FIG. 1 shows an output circuit according to an embodiment of the first aspect of the present invention. The output circuit has pnp-type bipolar transistors Q1, Q2, and QE2, npn-type bipolar transistors Q3, Q4, Q5, and QE1, current sources CS1 and CS2, a capacitor Cc, a resistor Rp, and diodes Dp, D1, and D2. The output circuit includes a high-potential power source V1 and a low-potential power source V2, i.e., ground GND0.

The transistors Q1, Q2, Q3, and Q4 and current source CS1 form a differential circuit, which receives an input IN and an inverted input /IN and provides an output to the base of the transistor Q5. The emitters of the transistors Q1 and Q2 are connected together to the high-potential power source V1 through the current source CS1. The collector of the transistor Q1 is connected to the collector of the transistor Q3 and to the bases of the transistors Q3 and Q4. The collector of the transistor Q2 is connected to the collector of the transistor Q4 and the base of the transistor Q5. The output of the differential circuit is provided, by the collector of the transistor Q2, to the base of the transistor Q5. The bases of the transistors Q1 and Q2 receive an inverted input /IN and a non-inverted input IN, respectively. The emitters of the transistors Q3 and Q4 are connected to the low-potential power source V2.

The capacitor Cc is a phase compensation capacitor connected between the base and collector of the transistor Q5. The collector of the transistor Q5 is connected to the high-potential power source V1 through the diodes D1 and D2 and current source CS2. The diodes D1 and D2 are connected in series, to bias the output transistors QE1 and QE2. The collector of the transistor Q5 is also connected to the base of the transistor QE2. The emitter of the transistor Q5 is connected to the low-potential power source V2. A node between the current source CS2 and the anode of the diode D1 is connected to the base of the transistor QE1.

The transistors QE1 and QE2, i.e., output transistors form a push-pull circuit. These transistors are external to the IC (LSI). The collector of the transistor QE1 is connected to the high-potential power source V1. The collector of the transistor QE2 is connected to the low-potential power source V2. The emitter of the transistor QE1 provides the output OUT of the output circuit. Between the emitters of the transistors QE1 and QE2, the resistor Rp and diode Dp are connected in parallel. The resistor Rp is a feedback resistor for stabilizing an output idle current, and the diode Dp clamps a voltage drop caused by the resistor Rp. An end of the resistor Rp and the anode of the diode Dp are connected to the emitter of the transistor QE1. The other end of the resistor Rp and the cathode of the diode Dp are connected to the emitter of the transistor QE2. The resistor Rp and diode Dp are arranged inside the IC.

The output circuit of FIG. 1 differs from that of FIG. 15 in that the emitters of the transistors QE1 and QE2 are indirectly connected to each other, the emitter of the transistor QE1 provides the output OUT, and the resistor Rp and diode Dp are connected in parallel with each other between the emitters of the transistors QE1 and QE2.

According to the first aspect of the present invention of FIG. 1, the resistor Rp arranged between the emitters of the external transistors QE1 and QE2 suppresses a fluctuation in the output idle current I3. The diode Dp connected in parallel with the resistor Rp clamps a voltage drop caused by the resistor Rp due to a load current, to thereby improve the range of output voltages when there is a load current.

If the resistance of the resistor Rp is zero ohms, a forward voltage VF of the diode Dp is expressed as follows:

$$VF = \frac{kT}{q} \cdot \ln\left[\frac{IF}{ISD}\right] \qquad (1)$$

where k is a Boltzmann constant, T is an absolute temperature, q is an element charge, IF is a forward current (=I2) passing through the diode, and ISD is the saturation current of the diode.

If the transistors QE1 and QE2 are of complementary type, and if the saturation currents IS1 and IS2 of these transistors are equal to each other, the output idle current I3 is expressed as follows:

$$I3 = ISN \cdot e^{q/kT \cdot VF} \qquad (2)$$

According to the expressions (1) and (2), the idle current I3 is as follows:

$$I3 = ISN \cdot e^{\ln\left[\frac{I2}{ISD}\right]} = \frac{ISN}{ISD} \cdot I2 \qquad (3)$$

Namely, the idle current I3 is determined by the ratio of the saturation current ISD of the diode Dp installed inside the IC to the saturation current IS1 (IS2) of the external transistor QE1 (QE2).

The saturation current of an IC or a transistor usually fluctuates in the order of one to two digits, to fluctuate the idle current in the order of four digits. Namely, the idle current may fluctuate in the order of 100 times.

To limit the idle current I3, the resistor whose resistance is Rp is connected in series with the external transistors QE1 and QE2. Then, the idle current I3 will be as follows:

$$I3 = ISN \cdot e^{\frac{q}{kT} \cdot (VF - I3 \cdot \frac{Rp}{2})} \qquad (4)$$

In the expression (4), (VF−I3*Rp/2) means that the resistor Rp serves as a negative feedback resistor for the idle current I3. Accordingly, if the resistance of the resistor Rp is increased to about several hundreds of ohms or larger, a fluctuation in the idle current I3 will be suppressed.

A load current flowing through the resistor Rp is branched and clamped by the diode Dp connected in parallel with the resistor Rp, to limit a decrease in the maximum output voltage to the forward voltage of the diode Dp when there is a load current. When a minimum voltage is important, the output OUT is provided from the emitter of the transistor QE2, and when a maximum voltage is important, it is provided from the emitter of the transistor QE1.

Figure 2:
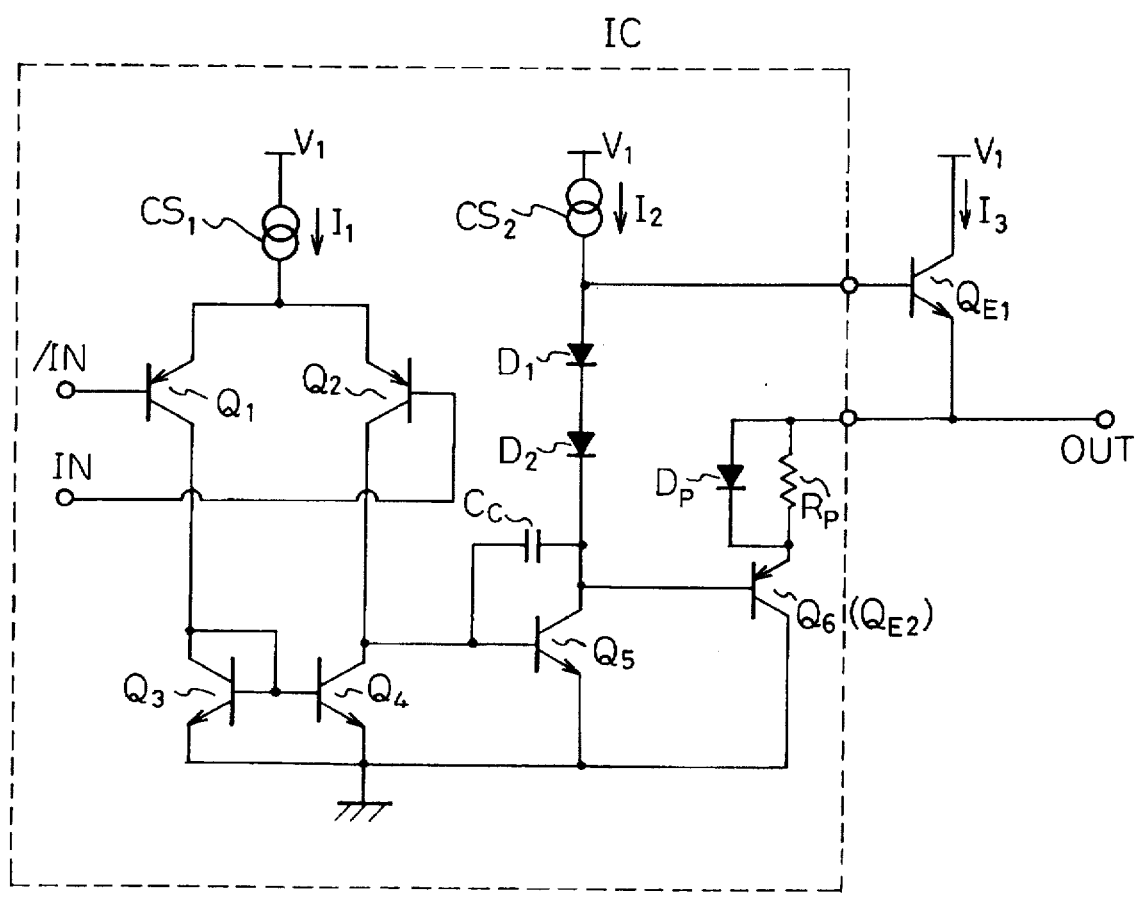
FIG. 2 shows an output circuit according to another embodiment of the first aspect of the present invention.

FIG. 2 shows an output circuit according to another embodiment of the first aspect of the present invention.

The transistor Q6 of this embodiment corresponds to the transistor QE2 of the preceding embodiment and forms a push-pull circuit with a transistor QE1. The transistor Q6 is arranged inside an IC. The capacity of an output circuit for driving an output current differs between sink and source operations. If the performance of the sink operation is low and that of the source operation is high, the transistor Q6 may be arranged inside the IC. If the performance of the sink operation is high and that of the source operation is low, the transistor QE1 may be arranged inside the IC. These configurations reduce the number of external transistors to one.

Figure 3:
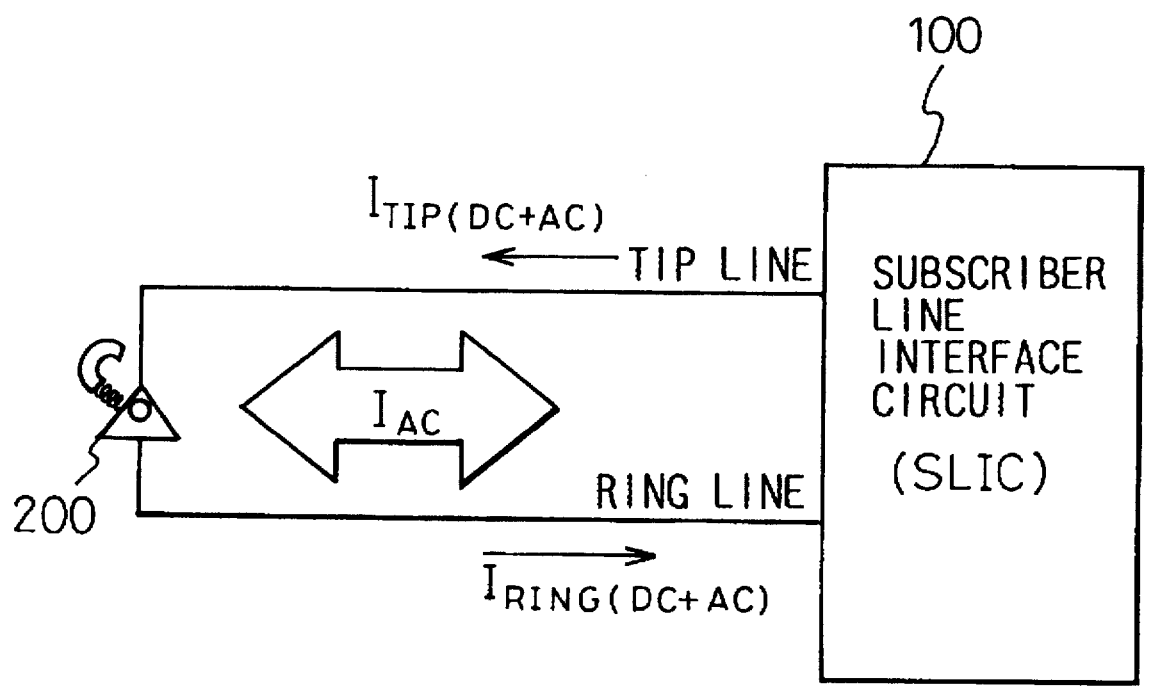
FIG. 3 schematically shows a subscriber line interface circuit employing the output circuit of the present invention.

FIG. 3 schematically shows a subscriber line interface circuit (SLIC) 100 of an exchange employing output circuits each of the present invention. The SLIC 100 is connected to a telephone set 200 through a pair of parallel telephone lines involving a tip line and a ring line.

When the telephone set 200 is used, the tip and ring lines form a direct-current loop, so that the SLIC 100 handles direct currents ITIP and IRING with respect to the telephone set 200. An alternating-current voice signal (AC) is transmitted on the direct currents ITIP and IRING, to carry voice. The alternating current of the voice signal is smaller than the direct currents so that the directions of the direct currents ITIP and IRING will never be reversed even with the maximum alternating current.

In practice, a distance between the station (100) and the subscriber (200) is long, so that an induction current IAC due to commercial power source overlaps the direct currents in the tip and ring lines. At this time, the direction of the induction current IAC is additive with respect to one of the direct currents ITIP and IRING and subtractive with respect to the other. When the induction current IAC is greater than the current ITIP (IRING), the output current of the SLIC will be reversed. Even under this state, the voice signal must not be distorted.

Figure 4:
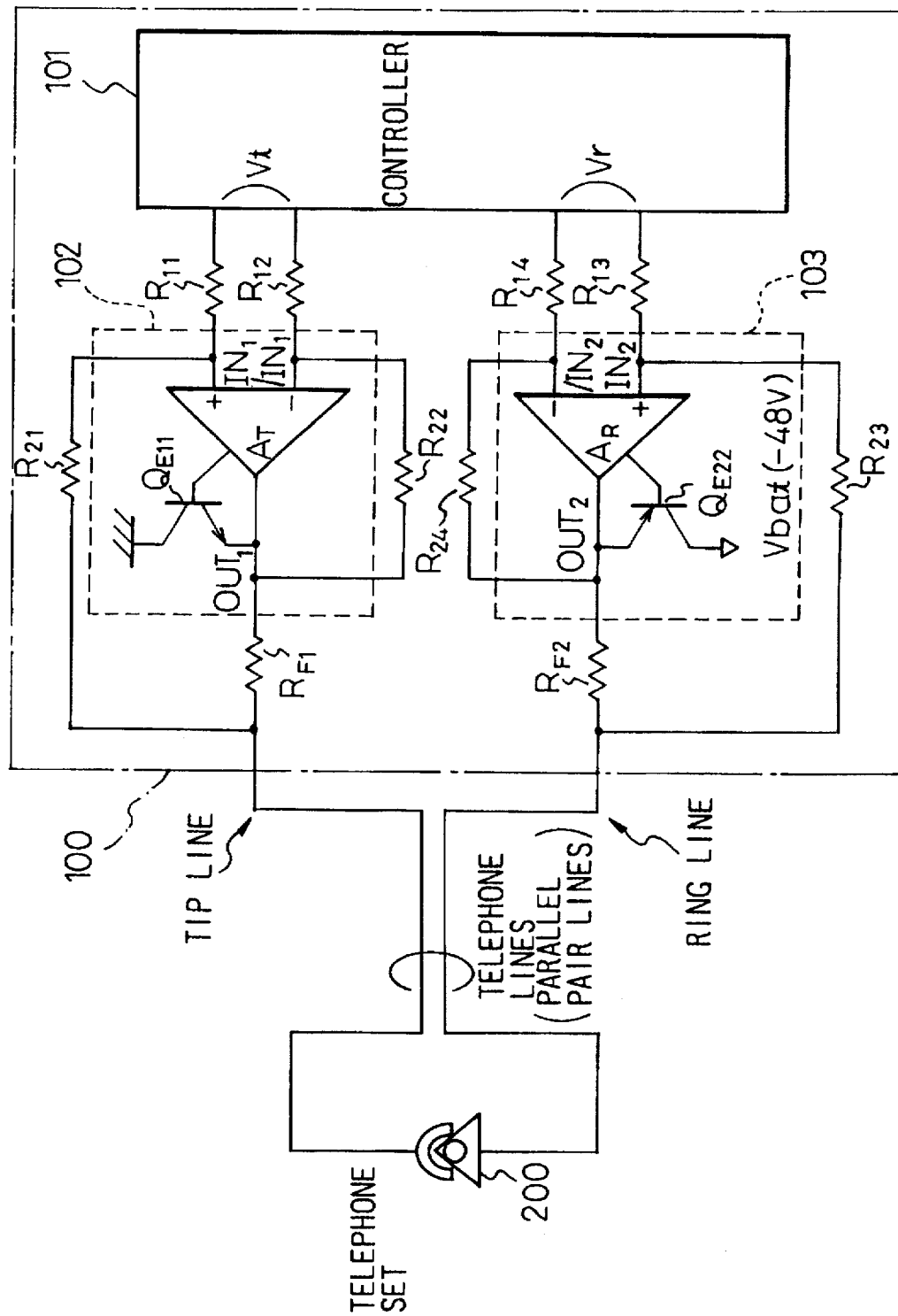
FIG. 4 shows the subscriber line interface circuit of FIG. 3.

FIG. 4 shows an example of the SLIC 100 of FIG.

The SLIC 100 has a controller 101, an output circuit (AT) 102 for the tip line, and an output circuit (AR) 103 for the ring line. The output Vt of the controller 101 is supplied as inputs IN1 and /IN1 to the output circuit 102 through resistors R11 and R12. The output Vr of the controller 101 is supplied as inputs IN2 and /IN2 to the output circuit 103 through resistors R13 and R14. An output OUT1 from the output circuit 102 is supplied to the tip line through a resistor RF1. An output OUT2 from the output circuit 103 is supplied to the ring line through a resistor RF2. Resistors R21 and R22 are bias resistors for the output circuit 102, and resistors R23 and R24 are bias resistors for the output circuit 103.

The output circuits 102 and 103 are operated by a ground voltage GND of 0 V and a voltage Vbat of −48 V. A bias current may be formed from a source voltage Vcc of +5 V. The outputs Vt and Vr of the controller 101 control the currents ITIP and IRING (or voltages if load is fixed) in the tip and ring lines. When the telephone set is not used, the output circuits 102 and 103 are turned off, and the direct current loop of the tip and ring lines disappears. At this time, the tip line is set to the ground level GND, and the ring line to the voltage Vbat.

Figure 5:
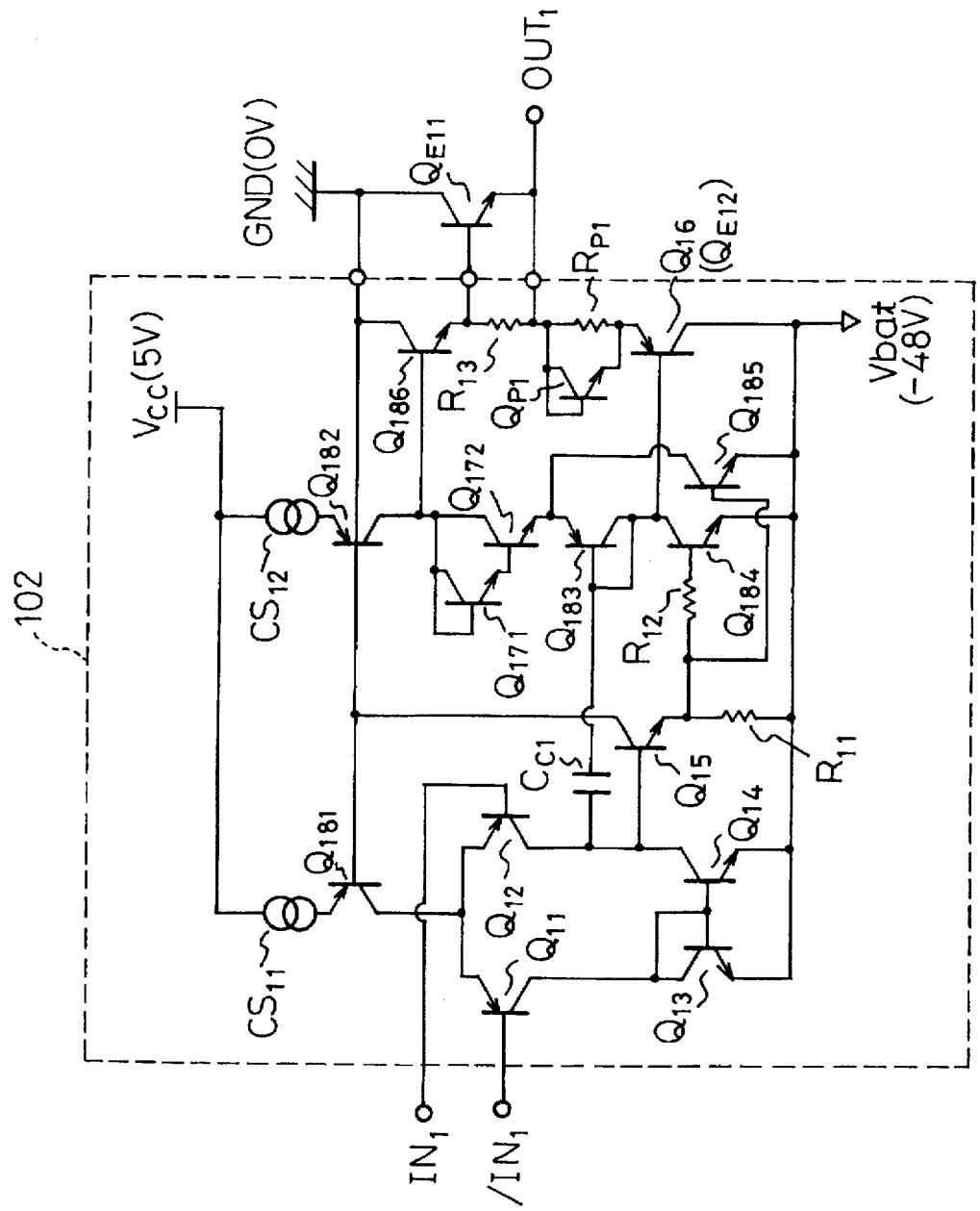
FIG. 5 shows an output circuit connected to a tip line of the subscriber line interface circuit of FIG. 4.
Figure 6:
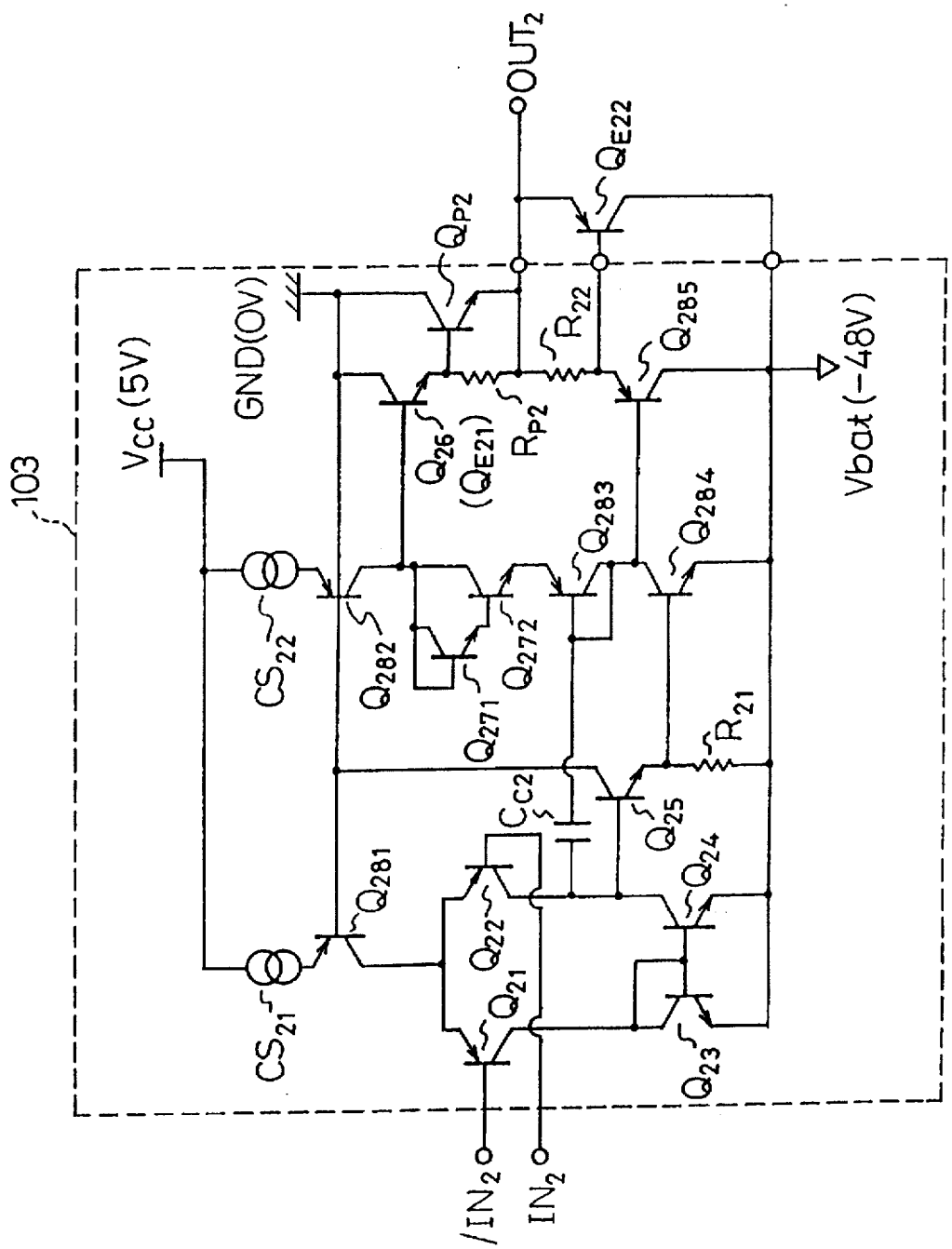
FIG. 6 shows an output circuit connected to a ring line of the subscriber line interface circuit of FIG. 4.

FIG. 5 shows an example of the output circuit 102 for the tip line of the SLIC of FIG. 4. FIG. 6 shows an example of the output circuit 103 for the ring line of the SLIC of FIG. 4.

In FIG. 5, the output circuit 102 has pnp-type bipolar transistors Q11, Q12, Q16, Q181, Q182, and Q183, npn-type bipolar transistors Q13, Q14, Q15, Q171, Q172, Q184, Q185, Q186, Qp1, and QE11, current sources CS11 and CS12, a capacitor Cc1, and resistors Rp1, R11, R12, and R13. The transistors Q171 and Q172 correspond to the diodes D1 and D2 of FIGS. 1 and 2, the transistor Qp1 corresponds to the voltage drop clamping diode Dp, and the transistor Q16 corresponds to the transistor QE2 (QE12).

The resistor Rp1 is a feedback resistor for stabilizing an output idle current, and the transistor Qp1 clamps a voltage drop due to the resistor Rp1. The resistor Rp1 and transistor Qp1 are arranged between the emitters of the output transistors QE11 and Q16 that form a push-pull circuit. Since the output circuit 102 is for the tip line for which a maximum voltage is important, an output OUT1 is provided from the emitter of the external npn-type transistor QE11. The source voltage Vcc of +5 V is applied to the current sources CS11 and CS12. The transistor Q186 and resistor R13 set the output OUT1 for the tip line to the ground level GND of 0 V.

The output circuit 103 of FIG. 6 has pnp-type bipolar transistors Q21, Q22, Q281, Q282, Q283, Q285, and QE22, npn-type bipolar transistors Q23, Q24, Q25, Q26, Q271, Q272, Q284, and Qp2, current sources CS21 and CS22, a capacitor Cc2, and resistors Rp2, R21, and R22. The transistors Q271 and Q272 correspond to the diodes D1 and D2 of FIGS. 1 and 2, the transistor Qp2 corresponds to the voltage drop clamping diode Dp, and the transistor Q26 corresponds to the transistor QE1 (QE21).

In the output circuit 103 of FIG. 6, the resistor Rp2 is a feedback resistor for stabilizing an output idle current, and the transistor Qp2 clamps a voltage drop due to the resistor Rp2. The resistor Rp2 and transistor Qp2 fare arranged between the emitters of the output transistors QE22 and Q26 that form a push-pull circuit. Since the output circuit 103 is used for the ring line for which a minimum voltage is important, an output OUT2 is provided from the emitter of the external pnp-type transistor QE22. The source voltage Vcc of +5 V is applied to the current sources CS21 and CS22. The transistor Q285 and resistor R22 set the output OUT2 for the ring line to the voltage Vbat of −48 V.

In this way, the SLIC employing the output circuits of the present invention is capable of minimizing a fluctuation and distortion in the characteristics thereof.

When transistors are externally arranged in an output section of an amplifier or a drive circuit, the first aspect of the present invention suppresses a fluctuation in an idle current in the output section due to fluctuations in the characteristics of internal and external elements, without sacrificing the range of output voltages when there is a load current. The first aspect of the present invention is capable of reducing power consumption when the amplifier or drive circuit is in a standby state. The external transistors and IC may be not only bipolar transistors but also MOS (MIS) transistors.

Figure 16:
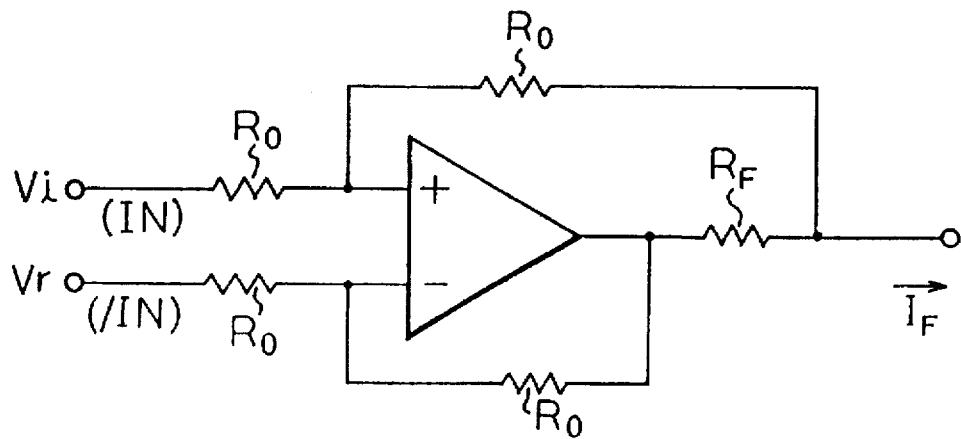
FIG. 16 shows an output circuit according to a prior art corresponding to the second aspect of the present invention.

FIG. 16 shows an output circuit according to a prior art corresponding to the second aspect of the present invention.

The prior art of FIG. 16 is a voltage-to-current converter employing an amplifier, to provide an output current IF in response to an input voltage (Vi−Vr). When resistance constants are as shown in FIG. 16, the input voltages and output current are as follows:

$$IF=(Vi-Vr)/RF \qquad (5)$$

According to the expression (5), the circuit of FIG. 16 is employable as an output circuit of an SLIC. The output circuit of FIG. 16 may be equal to the one shown in FIG. 15.

As explained above, the output circuit of FIG. 14 is disadvantageous because it causes crossover distortion. To solve this problem, the output circuit of FIG. 15 arranges the diodes D1 and D2 between the bases of the output transistors QE1 and QE2 that form a push-pull circuit.

Figure 17:
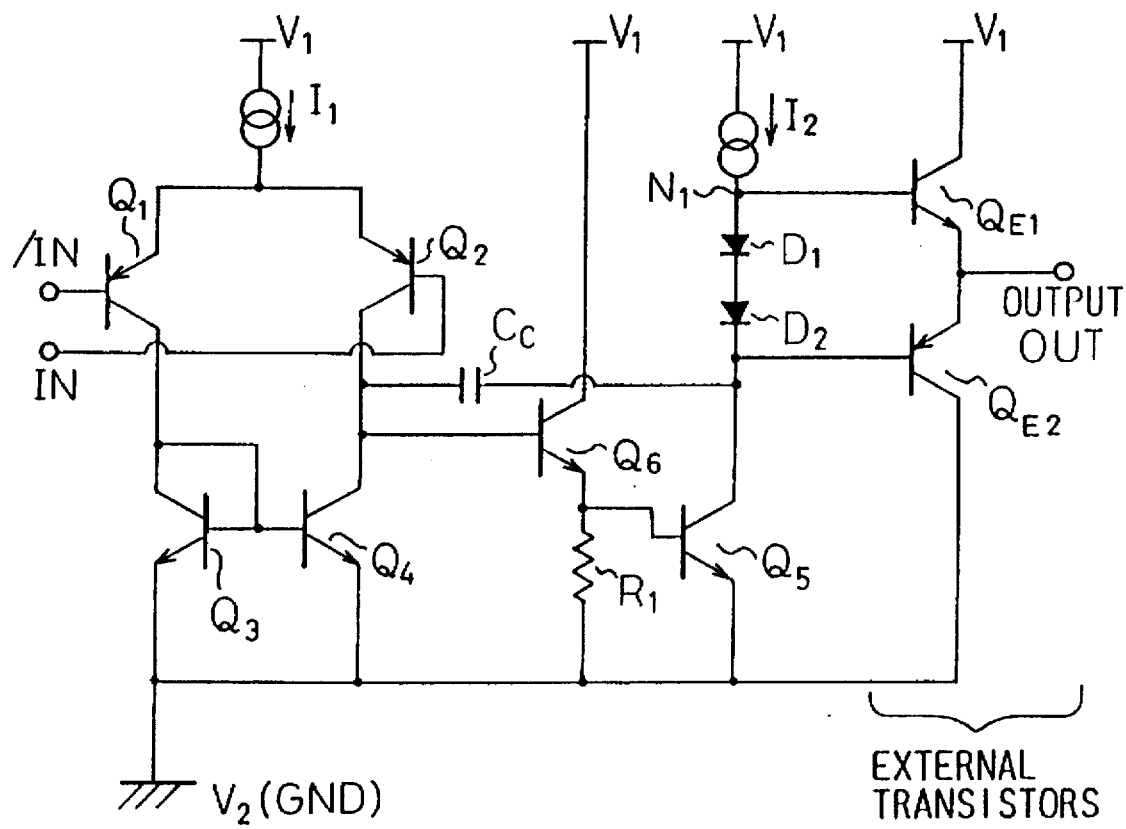
FIG. 17 shows the details of the output circuit of FIG. 16.

FIG. 17 shows the details of the output circuit of FIG. 16. The output circuit has a transistor Q6 and a resistor R1 in addition to the elements of the output circuit of FIG. 15. The collector of the transistor Q6 is connected to a high-potential power source V1. The emitter of the transistor Q6 is connected to the base of a transistor Q5 as well as to a low-potential power source V2 (GND) through the resistor R1. The base of the transistor Q6 is connected to a node (the output of a differential amplifier) between the collectors of transistors Q2 and Q4.

Figure 18:
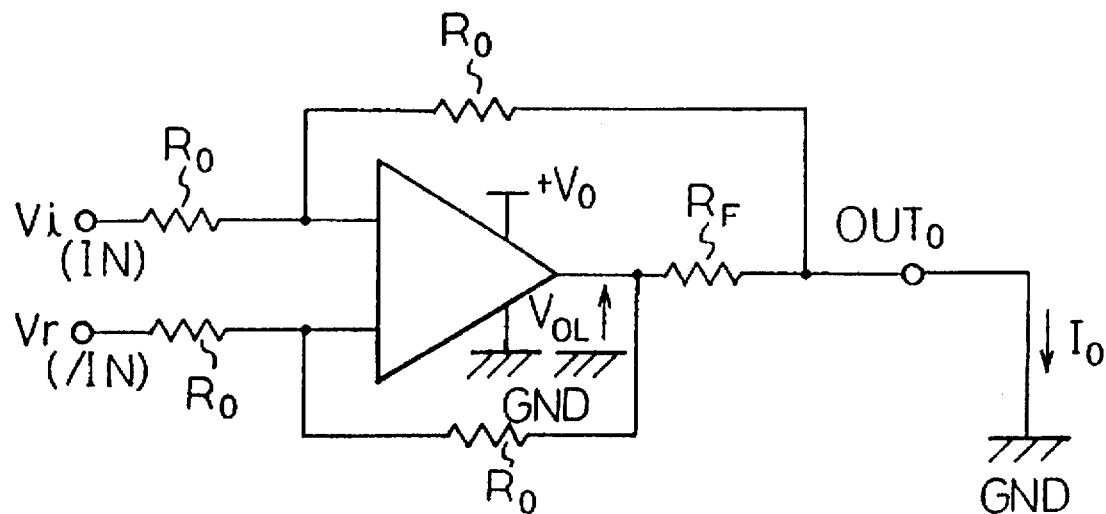
FIG. 18 illustrates the problems of the output circuit of FIG. 17.

FIG. 18 illustrates the problems of the output circuit of FIG. 17.

When the output circuit is used as a current source with the power source of the amplifier of the output circuit being +V0 alone and an output OUT0 being grounded (connected to GND), an output current Io is as follows:

$$Io=(Vi-Vr)/RF \qquad (6)$$

To zero the output current Io with Vi=Vr, the low-level output Voltage VoL of the amplifier must be nearly zero. If the low-level output voltage VoL is not zero, the output current Io will never be below VoL/RF. When the output of the voltage-to-current converter operating between the grounding GND and the negative power source is short-circuited to the negative power source, a short occurs in the SLIC. At this time, a current flowing to the output terminal of the output circuit must be limited to prevent excessive power consumption. This current limiting function is called a ground fault/short protection.

When the output OUT0 of the output circuit of FIG. 18 decreases to the ground level GND or to the level of Vbat of −48 V if the output circuit is used for the SLIC, the level of the output OUT0 is increased by the base-emitter voltage VBE of the transistor Q6 even if the transistor Q5 is saturated. This is the limit of a low-level output voltage during a sink operation of the output circuit of FIG. 17. During a source operation, the amplifier operates as a voltage follower, and the node N1 of FIG. 17 provides an output voltage. This output voltage is also higher than the ground level GND by the forward voltage of the diode.

In this way, the output circuit of FIG. 17 is incapable of decreasing the output of the amplifier to the lowest potential necessary for achieving the ground fault/short protection of the SLIC. Here, the lowest potential is the ground level GND in FIG. 17, or the Vbat of −48 V if the output circuit is used for the SLIC.

Figure 7:
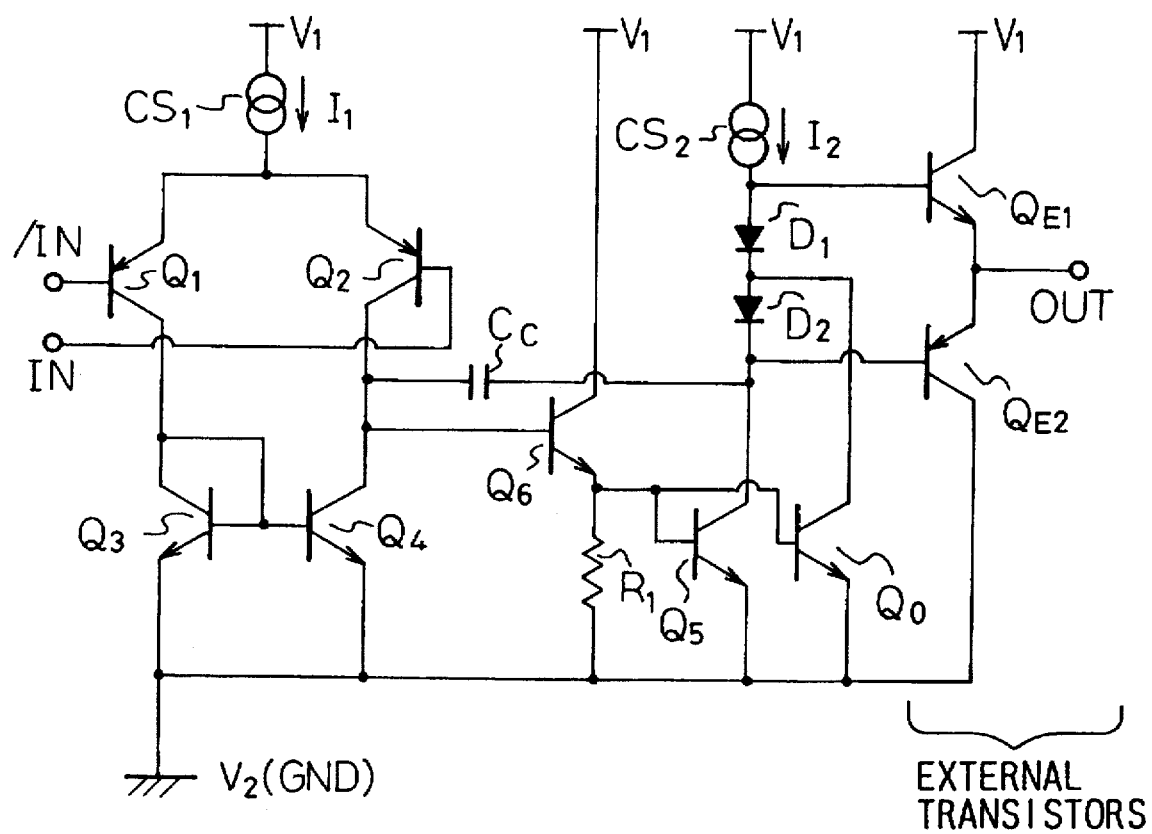
FIG. 7 shows an output circuit according to a first embodiment of a second aspect of the present invention.

FIG. 7 shows an output circuit according to the first embodiment of the second aspect of the present invention.

This embodiment adds an npn-type bipolar transistor Q0 to the arrangement of FIG. 17. The collector of the transistor Q0 is connected to a node between diodes D1 and D2 that are connected in series. The emitter of the transistor Q0 is connected to a low-potential power source V2 (GND). The base of the transistor Q0 is connected to the base of a transistor Q5 as well as to a node between the emitter of a transistor Q6 and a resistor R1. The transistors Q5 and Q6 form a Darlington circuit to amplify a current from an input section. The transistor Q0 is connected in parallel with the transistor Q5.

The normal operation of the output circuit of FIG. 7 will be explained. The transistors Q5 and Q0 in an output section pass current in parallel. Accordingly, the transistor Q0 does not hinder the operation of the amplifier. When the output of the amplifier decreases to a low level (GND or V2), the current from the transistor Q6 increases to saturate the transistor Q5 and drop the output voltage. At this time, the transistor Q0 is saturated together with the transistor Q5. As a result, the diode D2 provides no forward voltage. Namely, the base potential of the transistor QE1 that carries out a voltage follower operation changes from the ground level GND to the forward voltage of the diode D1, to drop the level of the output OUT to the ground level GND.

Figure 8:
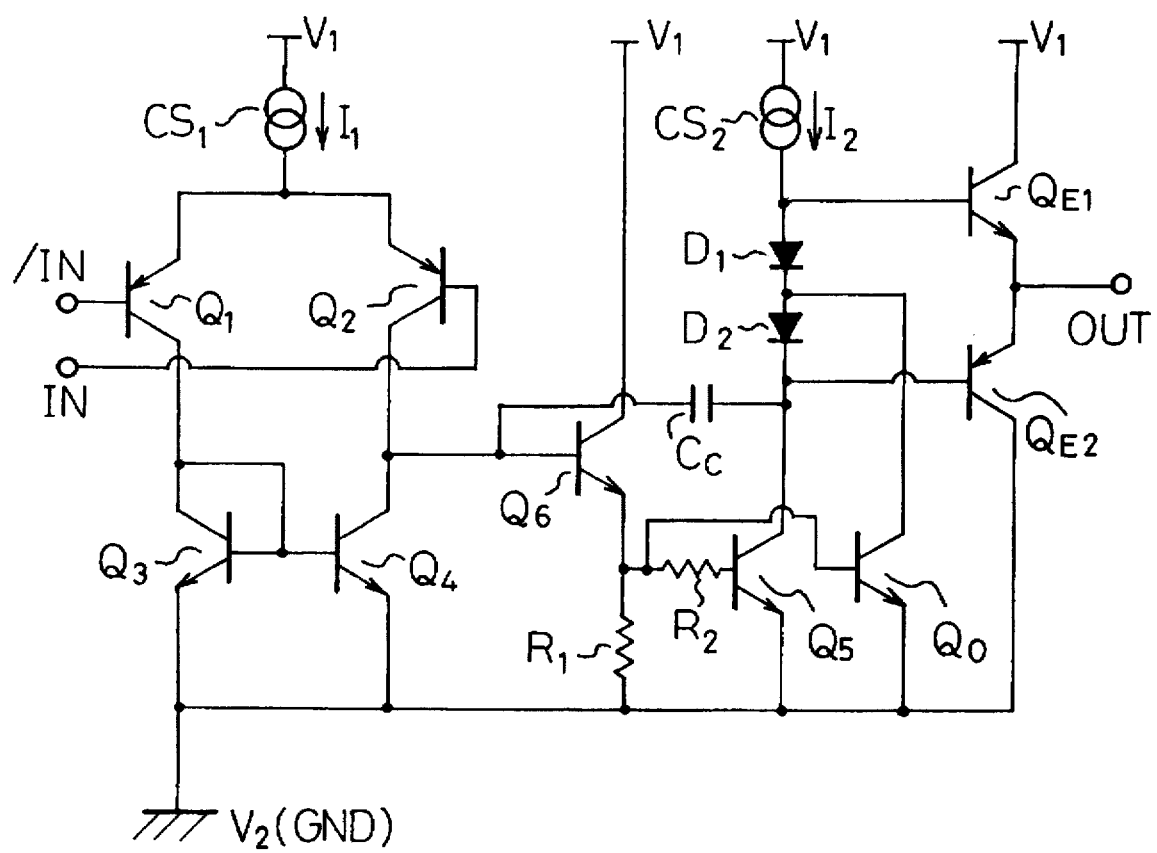
FIG. 8 shows an output circuit according to a second embodiment of the second aspect of the present invention.

FIG. 8 shows an output circuit according to the second embodiment of the second aspect of the present invention.

the resistor R2 is connected to the base of a transistor Q5, which corresponds to the transistor Q5 of FIG. 7. The node between the emitter of a transistor Q6 and a resistor R1 is connected to the base of a transistor Q0 directly as well as to the base of the transistor Q5 through the resistor R2. This prevents the transistor Q5 from saturating before the transistor Q0. Namely, the transistor Q0 is surely saturated.

Figure 9:
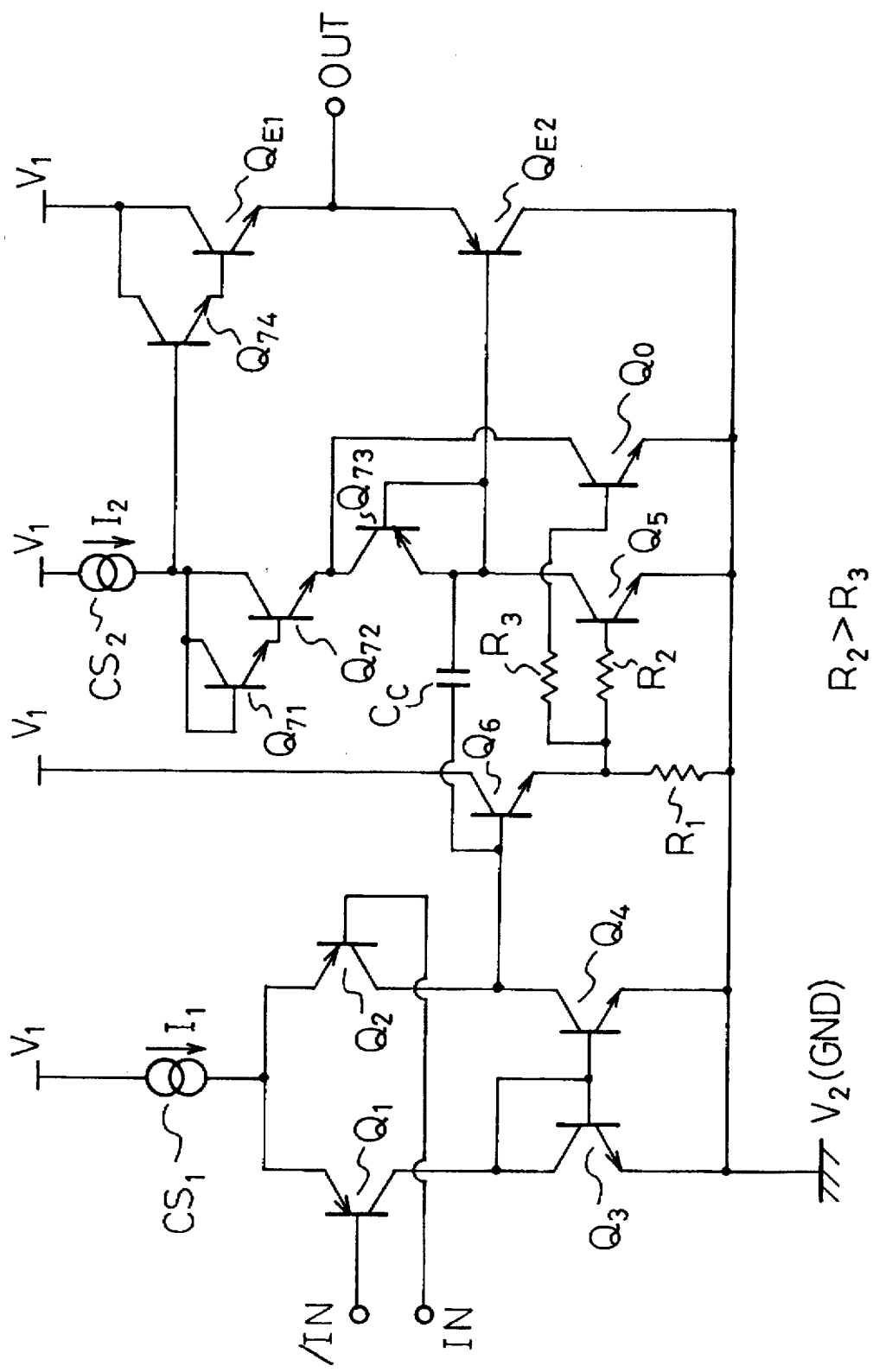
FIG. 9 shows an output circuit according to a third embodiment of the second aspect of the present invention.

FIG. 9 shows an output circuit according to the third embodiment of the second aspect of the present invention.

This embodiment connects a resistor R2 in series with the base of a transistor Q5 as in FIG. 8. In addition., this embodiment connects a resistor R3 to the base of a transistor Q0. Transistors Q74 and QE1 form a Darlington circuit to serve as one of the npn-type bipolar transistors that form a push-pull circuit. Transistors Q71, Q72, and Q73 form a Darlington circuit serving as two diodes D1 and D2 connected in series. The collector of the transistor Q0 is connected to a node between the emitter of transistor Q72 and the collector of transistor Q73. The resistance (R2) of the resistor R2 is greater than the resistance (R3) of the resistor R3.

Figure 10:
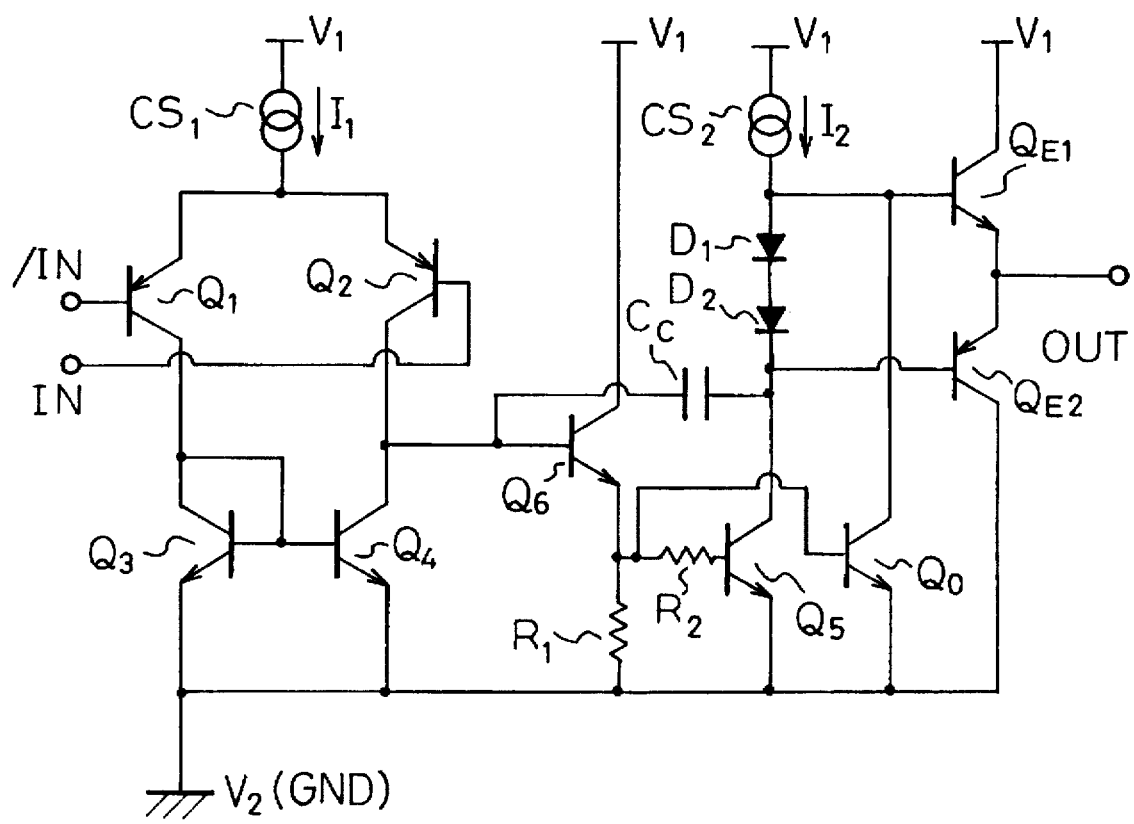
FIG. 10 shows an output circuit according to a fourth embodiment of the second aspect of the present invention.

FIG. 10 shows an output circuit according to the fourth embodiment of the second aspect of the present invention.

Unlike the output circuit of FIG. 8 that connects the collector of the transistor Q0 to the node between the diodes D1 and D2, the fourth embodiment of FIG. 10 connects the collector of a transistor Q0 to a node between a diode D1 and a current source CS2 and to the base of a transistor QE1. Since the collector of the transistor Q0 is connected to the base of the transistor QE1, the output circuit is a voltage follower, so that the potential of the emitter of the transistor QE1 may be decreased to a low level, i.e., the ground level GND.

Figure 11:
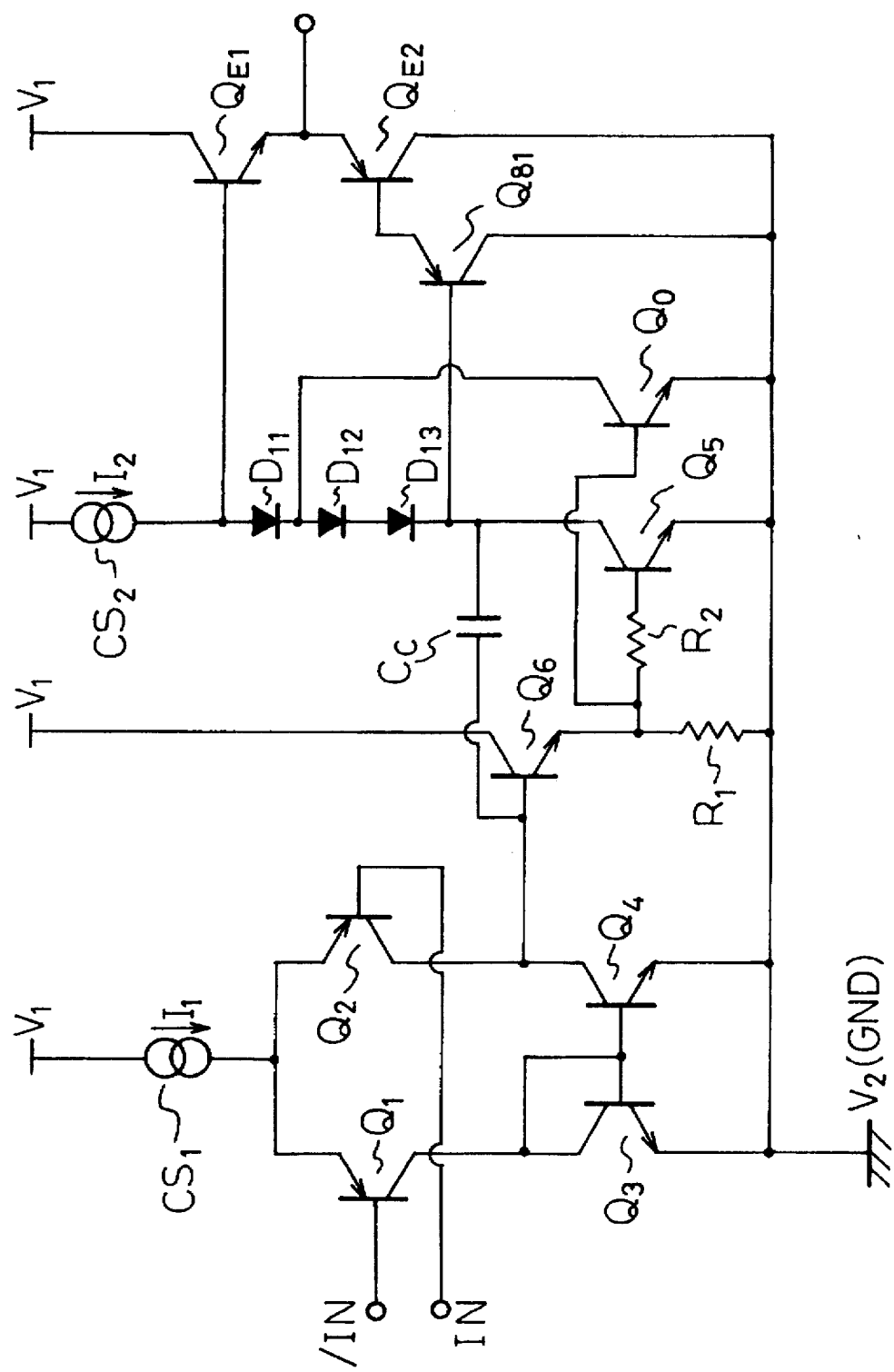
FIG. 11 shows an output circuit according to a fifth embodiment of the second aspect of the present invention.

FIG. 11 shows an output circuit according to the fifth embodiment of the second aspect of the present invention.

Transistors Q81 and QE2 form a Darlington circuit, which serves as a pnp-type bipolar transistor, i.e., one of the transistors that form a push-pull circuit. Three diodes D11, D12, and D13 correspond to the series-connected two diodes D1 and D2. The collector of a transistor Q0 is connected to a node between the diodes D11 and D12. The base of the transistor Q81 is connected to a node between the diode D13 and the collector of a transistor Q5.

In this way, any one of the embodiments of the second aspect of the present invention is capable of dropping the output of an amplifier, i.e., an output circuit to the minimum level when there is no output load or during a source operation of the output current. This is effective to limit a current to achieve the ground fault/short protection in an SLIC employing the output circuit of the present invention.

Figure 12:
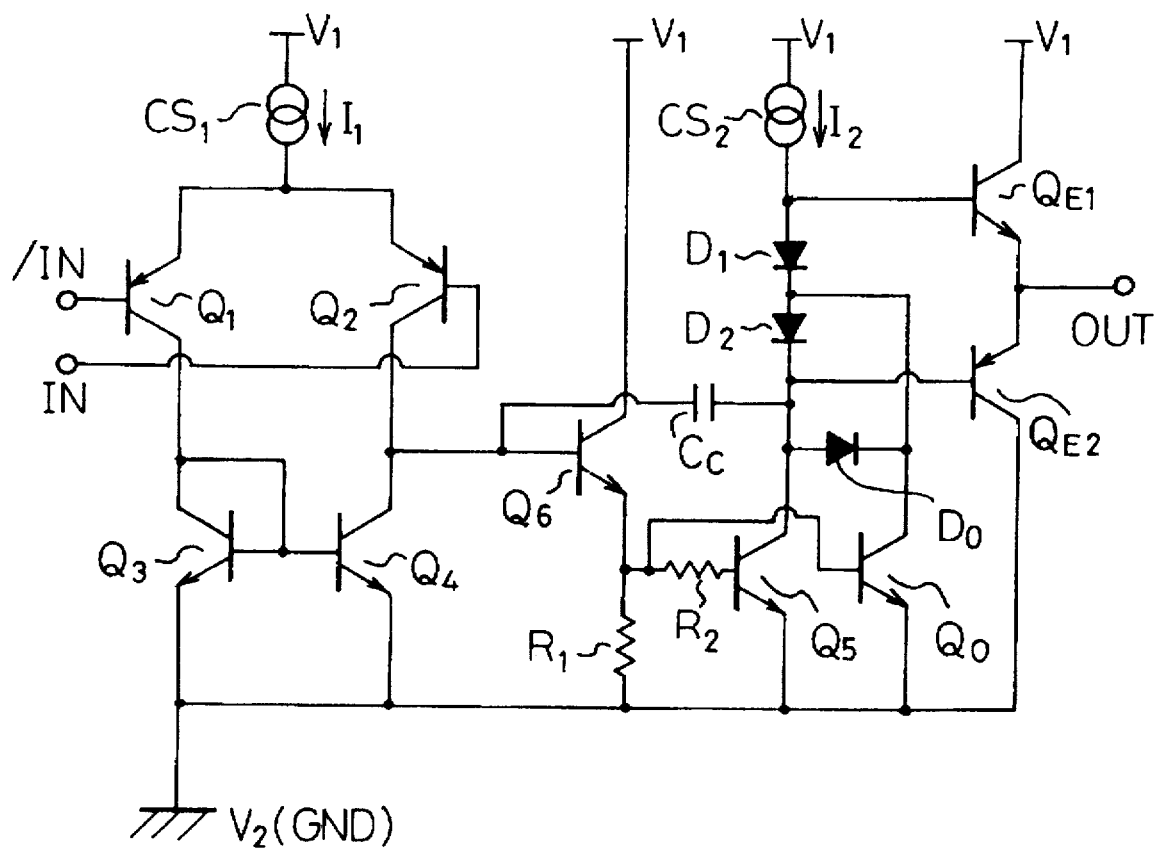
FIG. 12 shows an output circuit according to a modification of the embodiment of FIG. 7.
Figure 13:
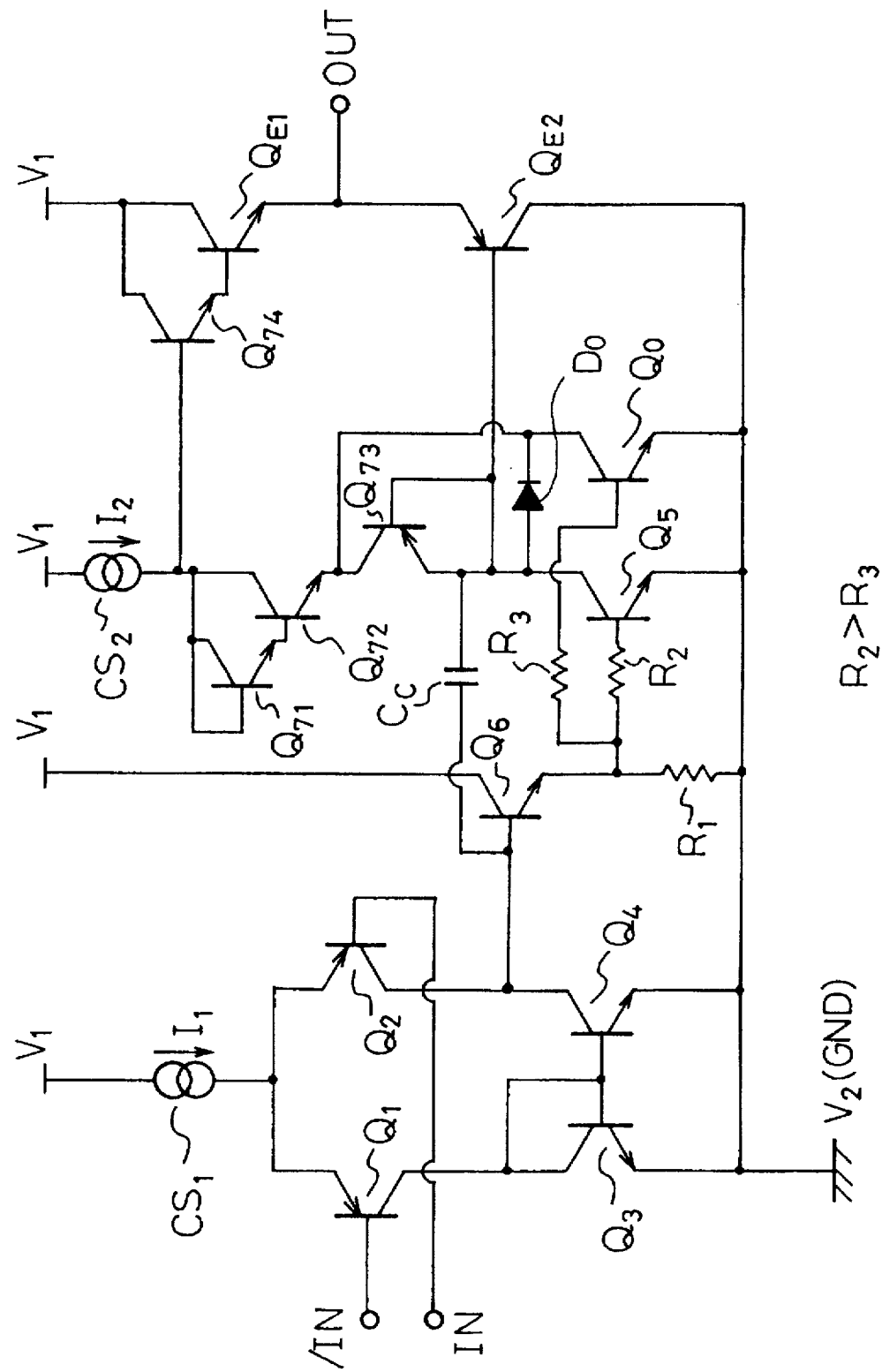
FIG. 13 shows an output circuit according to a modification of the embodiment of FIG. 9.

FIG. 12 shows a modification of the output circuit of FIG. 8. FIG. 13 shows a modification of the output circuit of FIG. 9.

The output circuit of any one of FIGS. 8 and 9 employs the npn-type bipolar transistor Q0 to drop an output voltage to the minimum level (ground level GND) when the transistor Q0 is saturated.

When the output terminal of the output circuit provides a current during a sink operation with an output voltage being not dropped to the lowest level, a current from the transistor Q6 flows to the bases of the transistors Q5 and Q0. In the output circuit of FIG. 8, the emitter of the transistor Q6 is connected to the base of the transistor Q0 directly as well as to the base of the transistor Q5 through the resistor R2. In the output circuit of FIG. 9, the emitter of the transistor Q6 is connected to the base of the transistor Q0 through the resistor R3 of small resistance as well as to the base of the transistor Q5 through the resistor R2 of large resistance. Accordingly, an increase in the base current of the transistor Q5 is small, and therefore, an increase in the collector current thereof is also small in any one of the output circuits of FIGS. 8 and 9. As a result, the performance of the transistor QE2 of pulling the current from the output OUT will be insufficient.

To solve this problem, the output circuits of FIGS. 12 and 13 contain a stabilizing diode D0 in addition to the arrangements of FIGS. 8 and 9. More precisely, the diode D0 is arranged between the collectors of the transistors Q5 and Q0, to prevent the collector potential of the transistor Q0 from dropping too low with respect to the collector potential of the transistor Q5.

In FIGS. 12 and 13, the transistors Q5 and Q6 form a Darlington circuit for amplifying a current from an input section. The transistor Q0 is connected in parallel with the transistor Q5. The diode D0 is inserted between the collectors of the transistors Q5 and Q0 such that the anode of the diode D0 is connected to the collector of the transistor Q5 and the cathode thereof is connected to the collector of the transistor Q0.

The operation of the output circuits of FIGS. 12 and 13 will be explained. When the output OUT is around the ground level GND, there is substantially no potential difference between the collectors of the transistors Q5 and Q0, so that the diode D0 is not turned ON. Namely, the diode D0 does nothing.

When a current flows in through the output OUT under a normal operation, a current from the transistor Q6 enters the base of the transistor Q5. Then, the base current of the transistor QE2 is pulled to pull the current from the output OUT. Since the resistor R2 is connected to the transistor Q5 as shown in FIG. 12, or since the resistance of the resistor R2 connected to the base of the transistor Q5 is larger than that of the resistor R3 connected to the base of the transistor Q0 as shown in FIG. 13, the current from the transistor Q6 is mostly the base current of the transistor Q0. Accordingly, an increase in the collector current of the transistor Q5 is small, so that the transistor QE2 insufficiently pulls the current from the output OUT.

At this time, a potential difference, corresponding to the difference between the collector currents of the transistors Q0 and Q5, is caused between the collectors of these transistors. When this potential difference becomes equal to the forward voltage of the diode D0, the diode D0 is turned ON, so that the transistors Q0 and Q5 start to draw base current from the transistor QE2. Consequently, the current from the output OUT is stably pulled by the transistor QE2.

In this way, the modifications of FIGS. 12 and 13 employ the diode D0 to compensate for an insufficient sink capacity of the transistor Q0 that is used to drop the output voltage of the amplifier to the lowest level (ground level), to thereby realize a stabilized current sink operation. Although the modifications are related to the embodiments of FIGS. 8 and 9, they are also applicable to the embodiments of FIGS. 5 and 10.

In this way, the output circuits according to the first and second aspects of the present invention may be modified in various ways. Although the above embodiments employ bipolar transistors, they may employ other semiconductor devices such as MOS transistors.

Operational amplifiers according to the present invention will now be explained.

Operational amplifiers capable of accurately controlling an output voltage without influencing an input source are required in various fields. A high voltage source of, for example, +15 V is used to drive an operational amplifier. If the output of the operational amplifier is connected as it is to a low-source-voltage circuit employing, for example, 5 V or 3 V, an overcurrent may flow to the low-source-voltage circuit and damage the same. It is necessary, therefore, to precisely limit the range of output voltages of the operational amplifier.

While limiting the output voltage of the operational amplifier, it is necessary to maintain a high-impedance input thereto. In this case, it is necessary to limit only the output without carrying out a feedback operation on the input.

Figure 19:
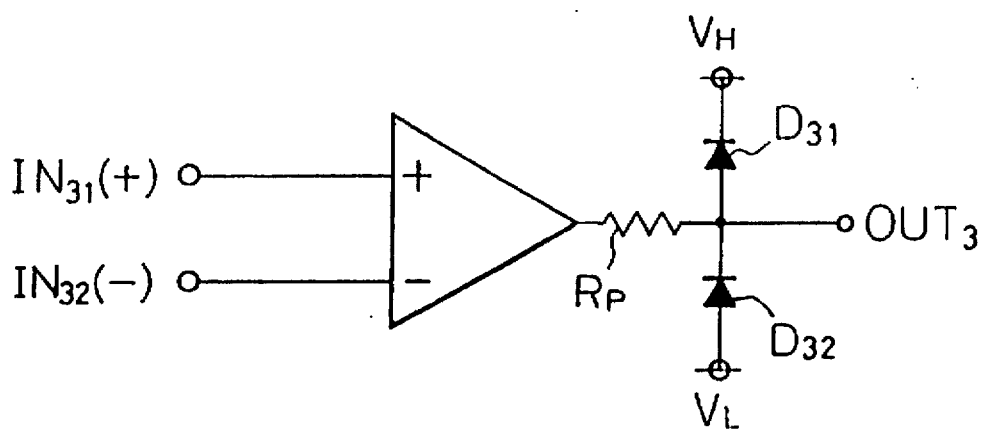
FIG. 19 shows an operational amplifier according to a prior art.
Figure 20:
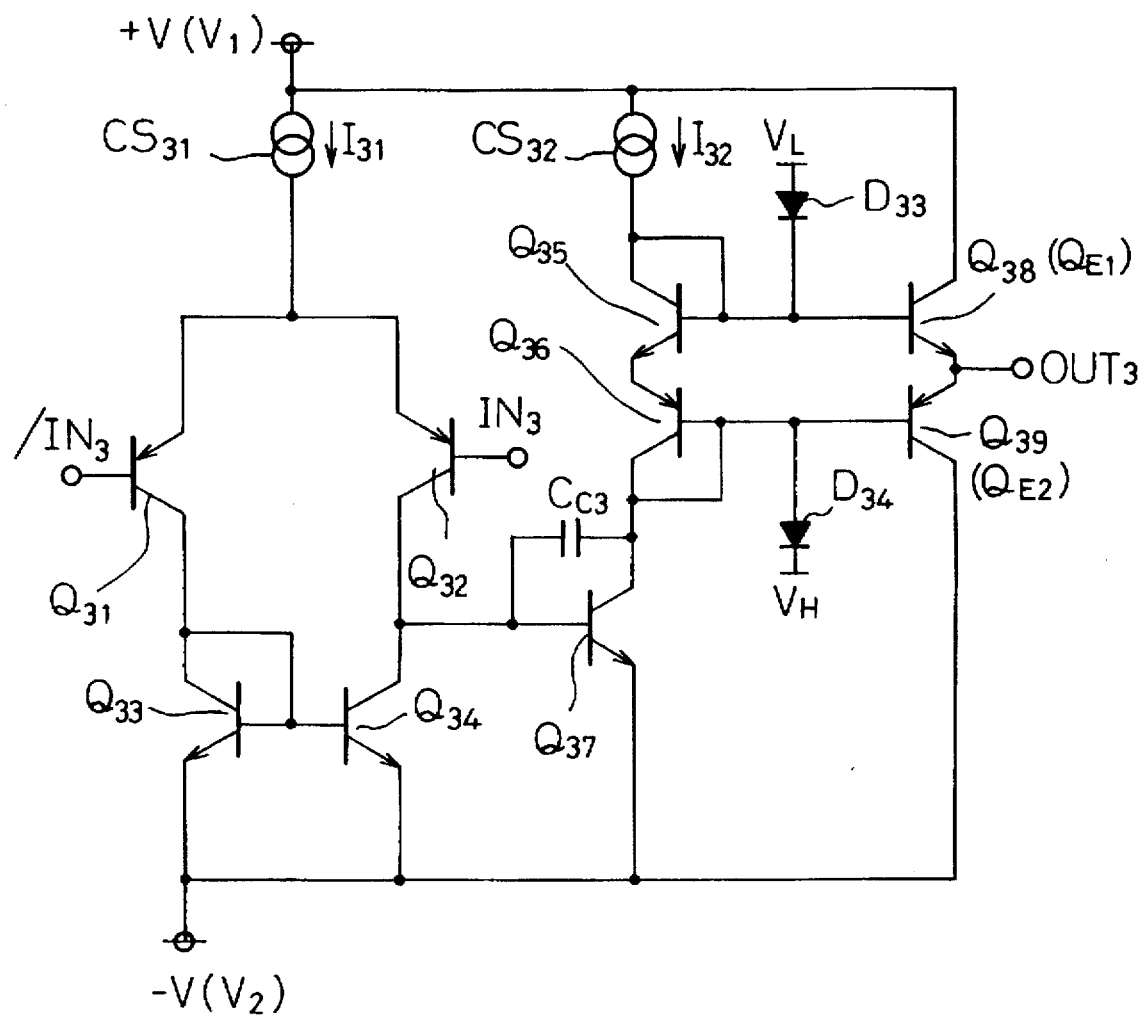
FIG. 20 shows an operational amplifier according to another prior art.

FIG. 19 shows an operational amplifier according to a prior art. FIG. 20 shows an operational amplifier according to another prior art.

The operational amplifier of FIG. 19 has an output voltage limiting function. The output of the operational amplifier is provided through a current limiting resistor Rp. The anode of a diode D31 and the cathode of a diode D32 are connected to a node for providing an output OUT3. The cathode of the diode D31 is connected to a high-level reference voltage VH, and the anode of the diode D32 is connected to a low-level reference voltage VL.

The voltage of the output OUT3 will never exceed the sum of the high-level reference voltage and a forward voltage of the diodes, or will never drop below the sum of the low-level reference voltage VL and a forward voltage of the diodes. According to the prior art of FIG. 19, the current limiting resistor Rp is connected to the node for providing the output OUT3 in series. This is disadvantageous because it increases the output impedance. of the operational amplifier, that was originally low.

The operational amplifier of FIG. 20 has an output voltage limiting function. The base potential of an npn-type bipolar transistor Q38 (QE1) in an output section of the operational amplifier is limited by a diode D33, and the base potential of a pnp-type bipolar transistor Q39 (QE2) is limited by a diode D34, to thereby limit the voltage of an output OUT3. The base of the transistor Q38 is connected to the cathode of the diode D33, and the base of the transistor Q39 is connected to the anode of the diode D34. The anode of the diode D33 is connected to a low-level reference voltage VL, and the cathode of the diode D34 is connected to a high-level reference voltage VH. Transistors Q31 to Q34 form a differential amplifier in an input section. Transistors Q35, 36, and Q37 form an intermediate section. The transistors Q38 and Q39 form the output section.

The circuit of FIG. 20 is capable of limiting an output voltage without increasing the output impedance of the operational amplifier. Since the output section limits the voltage, an input IN3 (/IN3) to the operational amplifier is not influenced. The voltage of the output OUT3 of the prior art of FIG. 20, however, deviates from a reference voltage by the forward voltage of the diodes. Since the forward voltage of the diodes depends on a current and temperature, it is difficult to precisely control the output voltage.

Figure 21:
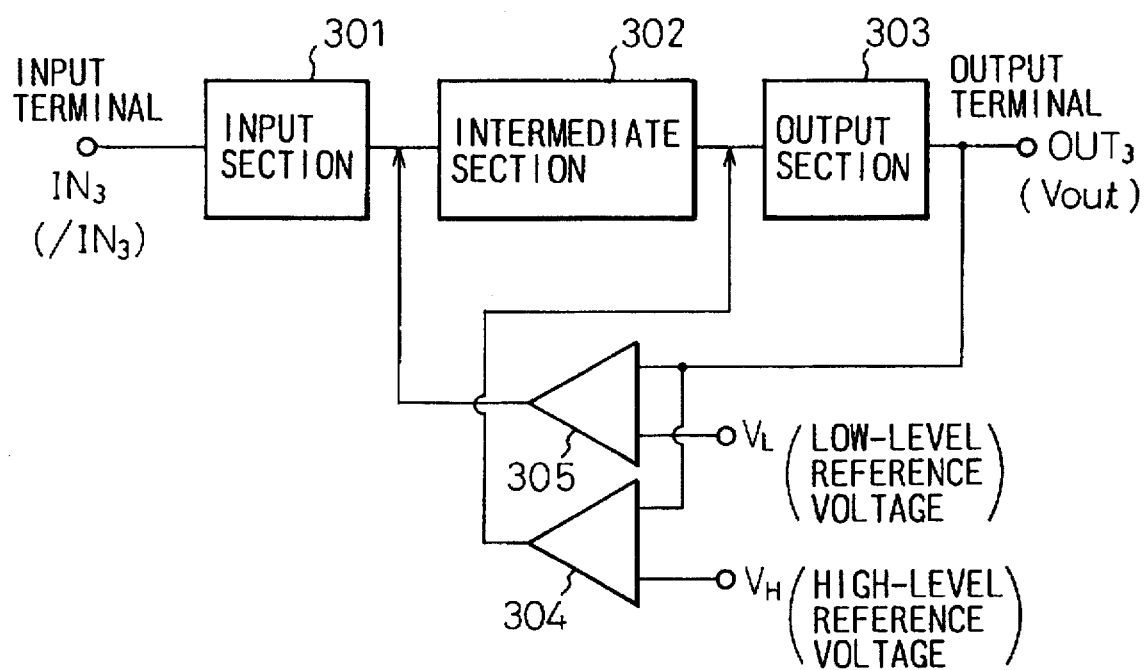
FIG. 21 illustrates the principle of an operational amplifier according to a third aspect of the present invention.

FIG. 21 shows the principle of an operational amplifier according to the third aspect of the present invention. The operational amplifier includes an input section 301, an intermediate section 302, an output section 303, and comparators (differential amplifiers) 304 and 305.

According to the first principle of the third aspect of the present invention, the comparator 304 compares an output voltage Vout with a reference voltage VH. The output of the comparator 304 is fed back as an input to the output section 303 without influencing the input IN3, to thereby limit the output voltage Vout.

According to the second principle of the third aspect of the present invention, the comparator 305 compares an output voltage Vout with a reference voltage VL. The output of the comparator 305 is fed back as an input to the intermediate section 302 without influencing the input IN3, to thereby limit the output voltage Vout.

Figure 22:
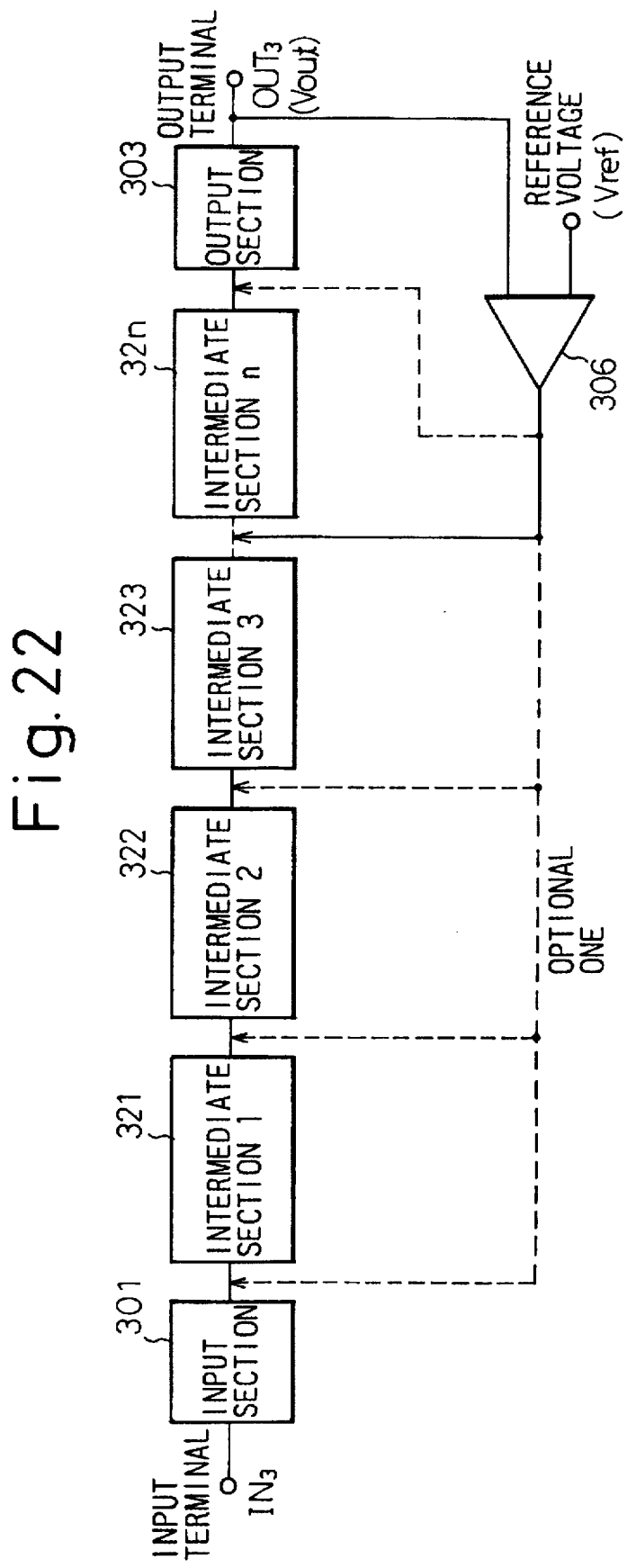
FIG. 22 illustrates the principle of an operational amplifier according to a fourth aspect of the present invention.

FIG. 22 shows the principle of an operational amplifier according to the fourth aspect of the present invention. This operational amplifier includes intermediate sections 321 to 32n between an input section 301 and an output section 303, and a comparator (differential amplifier) 306.

According to the first principle of the fourth aspect of the present invention, the operational amplifier has the intermediate sections 321 to 32n, and the comparator 306 compares an output voltage Vout with a reference voltage Vref. The output of the comparator 306 is fed back as an input to the output section 303 without influencing an input IN3, to thereby limit the output voltage Vout.

According to the second principle of the fourth aspect of the present invention, the operational amplifier has the intermediate sections 321 to 32n, and the comparator 306 compares an output Voltage rout with the reference voltage Vref. The output of the comparator 306 is fed back as an input to one of the intermediate sections 321 to 32n without influencing an input IN3, to thereby limit the output voltage Vout.

Figure 23:
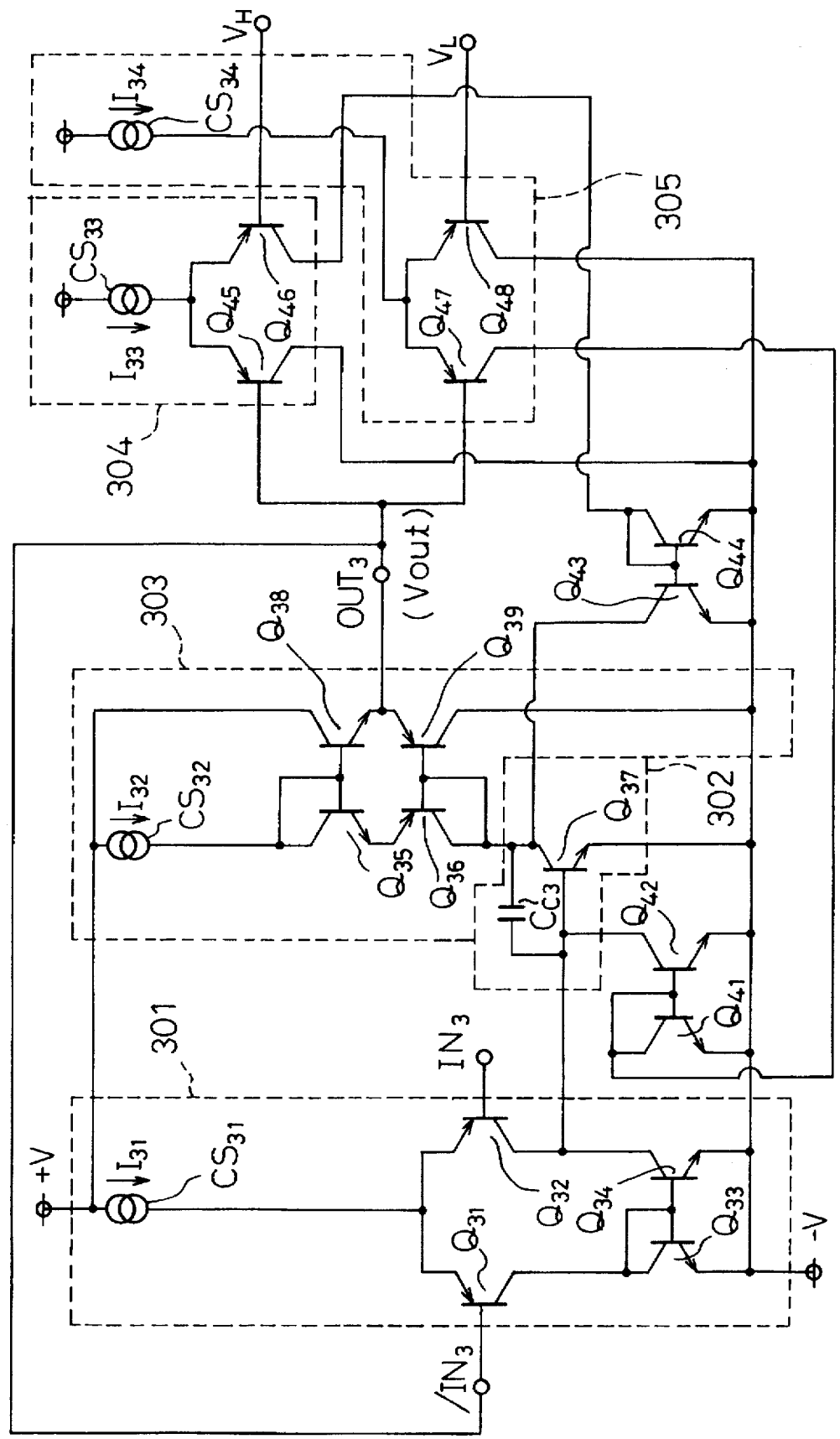
FIG. 23 shows an operational amplifier according to an embodiment of the present invention.

FIG. 23 shows an operational amplifier according to an embodiment of the present invention. This operational amplifier corresponds to the principle of FIG. 21. The operational amplifier has pnp-type bipolar transistors Q31, Q32, Q36, Q39, and Q45 to Q48, npn-type bipolar transistors Q33 to Q35, Q37, 38, and Q41 to Q44, a capacitor Cc3, and current sources CS31 to CS34.

The transistors Q31 to Q34 and current source CS31 form a differential circuit, i.e., an input section 301. The input section 301 receives an input IN3 and an inverted input /IN3 and provides the base of the transistor Q37 with an output. The phase compensating capacitor Cc3 is arranged between the base and collector of the transistor Q37. The transistor Q37 forms an intermediate section 302. The output of the input section 301 is an input to the base of the transistor Q37, i.e., the intermediate section 302. The output of the intermediate section 302 is provided from the collector of the transistor Q37 and serves as an input to the output section 303. The output section 303 has the transistors Q35, Q36, Q38, and Q39 and current source CS32.

The differential pair transistors Q45 and Q46 and the current source CS33 form a high level comparator 304 for comparing the output OUT3 of the operational amplifier with a high-level reference voltage VH. The differential pair transistors Q417 and Q48 and current source CS34 form a low-level comparator 305 for comparing the output OUT3 of the operational amplifier with a low-level reference voltage VL.

The output of the high-level comparator 304 is supplied to the collector of the transistor Q37 through the transistors Q44 and Q43, that form a current mirror circuit, and the transistor Q37 provides an output to the output section 303, to thereby realize a feedback operation. The output of the low-level comparator 305 is supplied to the base of the transistor Q37 through the transistors Q42 and Q41, that form a current mirror circuit, to thereby realize a feedback operation.

The operation of the operational amplifier of FIG. 23 will be explained. For the sake of simplicity of explanation, the output OUT3 of the operational amplifier serves as the inverted input /IN3, to form a voltage follower circuit.

When the input IN3 to the operational amplifier exceeds the high-level reference voltage VH, the collector of the transistor Q46 serving as the output terminal of the high-level comparator 304 passes a current. This current is mirrored by the transistors Q44 and Q43, to draw a current I32 from the current source CS32. Consequently, the collector potential of the transistor Q37 drops, and the potential of the output OUT3 is limited to the high-level reference voltage VH.

When the input IN3 to the operational amplifier drops below the low-level reference voltage VL, the output terminal of the low-level comparator 305, i.e., the collector of the transistor Q47 passes a current, which is mirrored by the transistors Q41 and Q42, to draw the base current of the transistor Q37. Consequently, the collector potential of the transistor Q37 increases, and the potential of the output OUT3 never drops below the low-level reference voltage VL.

In this way, the output voltage Vout of the output OUT3 is limited by the high-level reference voltage VH and low-level reference voltage VL.

To precisely limit the output voltage by the reference voltages VH and VL, it is necessary to equalize a control current applied to a feedback point to a bias current at the feedback point when the voltage Vout becomes equal to one of the reference voltages.

Currents I31 and I32 provided by the current sources CS31 and CS32 greatly differ from each other. Usually, the current I31 from the current source CS31 is smaller than the current I32 from the current source CS32. Accordingly, a feedback current for drawing the current I31 of the current source CS31, i.e., the maximum base current of the transistor Q37 must be smaller than a feedback current for drawing the current I32 of the current source CS32.

If currents I33 and I34 from the current sources CS33 and CS34 for the high- and low-level comparators 304 and 305 are equal to each other, and if the high-level reference voltage VH limits the output voltage Vout when the output OUT3 becomes equal to the high-level reference voltage VH, the low-level reference voltage VL will limit the output voltage rout before the output OUT3 becomes equal to the low-level reference voltage VL.

Accordingly, to correctly control the output voltage Vout by the reference voltages, it is necessary to make I32=I33 and I31=I34, or make the mirror ratio of the current mirror circuit of the transistors Q41 and Q42 different from that of the current mirror circuit of Q43 and Q44 to optimize a feedback current.

Figure 24:
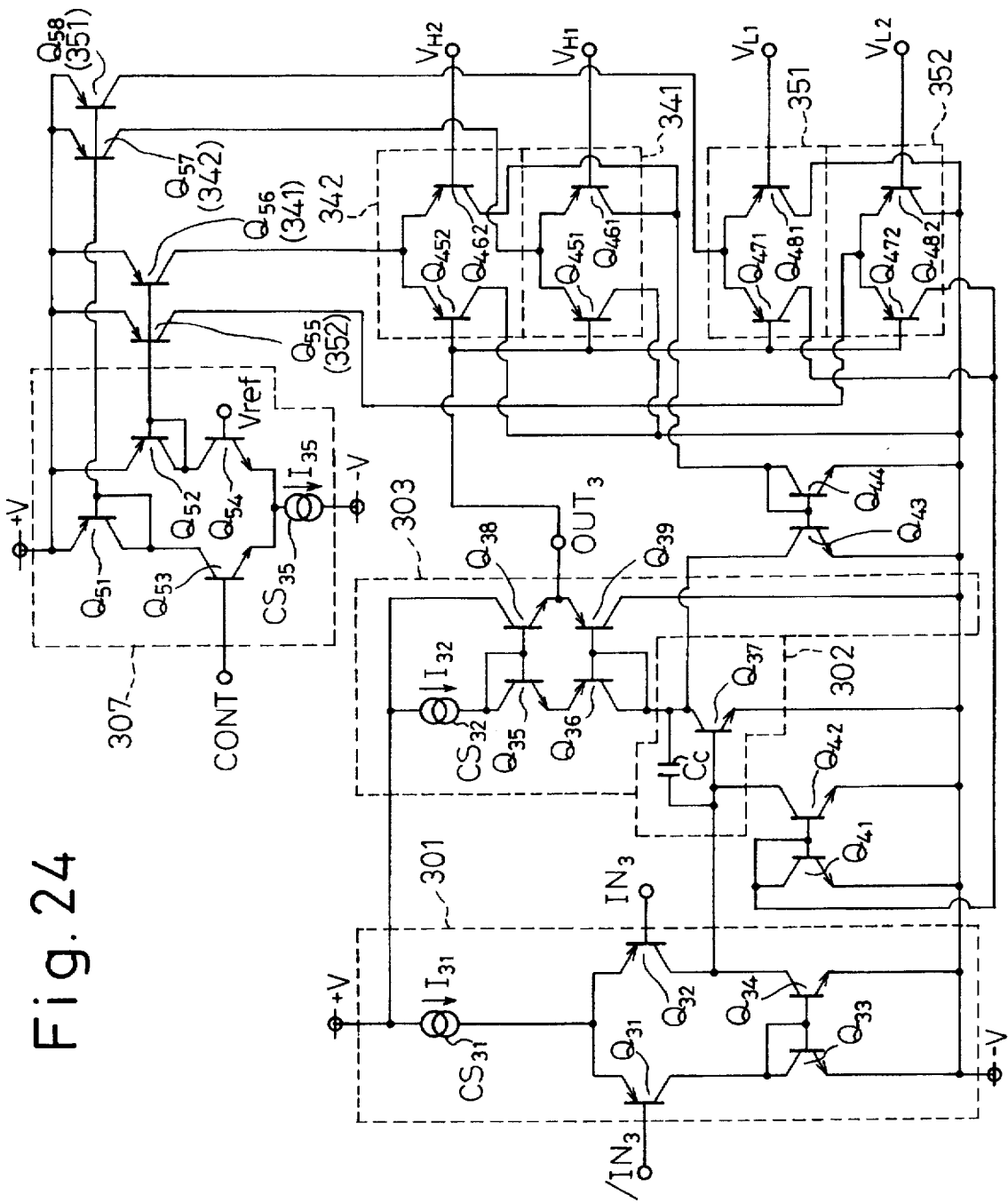
FIG. 24 shows an operational amplifier according to another embodiment of the present invention.

FIG. 24 shows an operational amplifier according to another embodiment of the present invention. This embodiment limits a plurality of voltage values.

This operational amplifier has two high-level comparators 341 and 342 and two low-level comparators 351 and 352. A controller 307 controls current sources Q57 and Q56 for the comparators 341 and 342, and current sources Q58 and Q55 for the comparators 351 and 352. The controller 307 consists of pnp-type bipolar transistors Q51 and Q52, npn-type bipolar transistors Q53 and Q54, and a current source CS35.

The first high-level comparator 341 consists of differential pair transistors Q451 and Q461 and the current source Q57. The second high-level comparator 342 consists of differential pair transistors Q452 and Q462 and the current source Q56. The first low-level comparator 351 consists of differential pair transistors Q471 and Q481 and the current source Q58. The second low-level comparator 352 consists of the pair of differential transistors Q472 and Q482 and the current source Q55. The bases of the transistors Q57 and Q58 receive a first output signal of the controller 307 from a node among the base and collector of the transistor Q51 and the collector of the transistor Q53. The bases of the transistors Q56 and Q55 receive a second output signal of the controller 307 from a node between the base and collector of the transistor Q52 and the collector of the transistor Q54. Accordingly, reference voltages to limit the voltage of an output OUT3 will be the high- and low-level reference voltages VH1 and VL1, or high- and low-level reference voltages VH2 and VL2.

When a control signal Sc supplied to a control terminal CONT of the controller 307 is high, the current source transistors Q57 and Q58 are turned ON to select the first reference voltages VH1 and VL1. When the control signal Sc is low, the current source transistors Q56 and Q55 are turned ON to select the second reference voltages VH2 and VL2. In this way, this embodiment selectively limits the voltage of the output OUT3.

Figure 25:
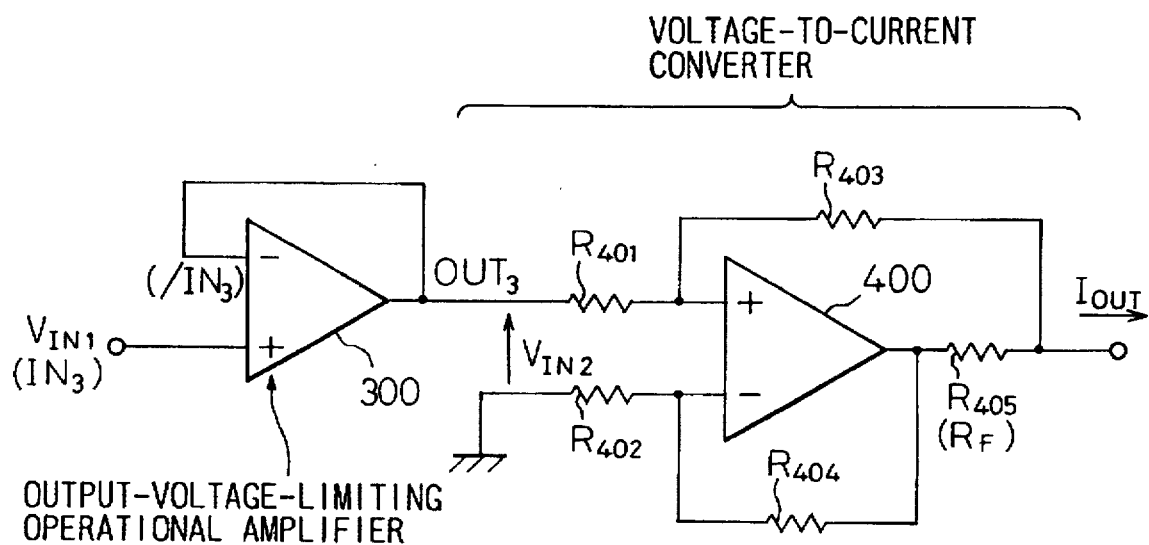
FIG. 25 shows a circuit employing the operational amplifier of the present invention.

FIG. 25 shows a circuit employing the operational amplifier of the present invention. The output OUT3 of the output section 303 of FIG. 24 is applied to a voltage-to-current converter.

To clamp an output current IOUT, it is necessary to detect the terminal voltage of a resistor R405 (RF) and carry out a feedback operation on an input. When the resistance of the resistor R405 is 100 ohms and the reference voltages are VH1=+1 V, VL1=−1 V, VH2=+2 V, and VL2=−2 V in the circuit of FIG. 25 employing the operational amplifier of FIG. 24, the output current IOUT will be +−1/100=+−10 mA when the control signal Sc is high. When the control signal Sc is low, the output current IOUT will be +−2/100=+−20 mA. In this way, the output current of the circuit of FIG. 25 is easily clamped.

Unlike the operational amplifier of the prior art of FIG. 20, the output-voltage-limiting operational amplifier of the present invention never shifts an output voltage by the forward voltage of diodes nor have dependency on current on temperature. The operational amplifier of the present invention, therefore, accurately limits an output voltage and is employed as an interface circuit between a high-voltage source circuit and a low-voltage source circuit. The operational amplifier of the present invention carries out a feedback operation on the output section thereof, to limit an output voltage without influencing an input, i.e., without changing the impedance of a high-impedance input.

Figure 26:
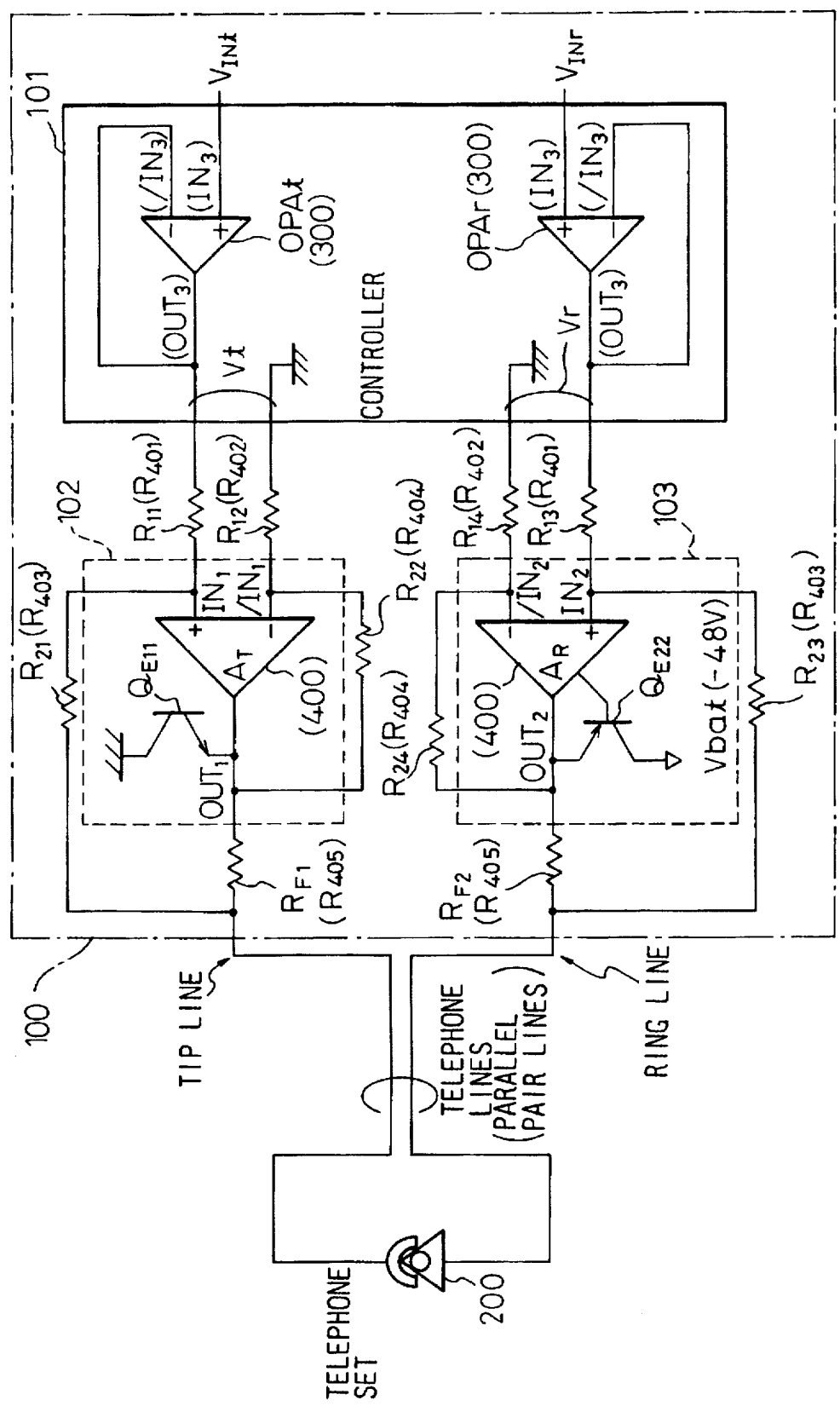
FIG. 26 shows a subscriber line interface circuit having a controller that employs the circuit of FIG. 25.

FIG. 26 shows operational amplifiers OPAt and OPAr each corresponding to the operational amplifier 300 of FIG. 25. These operational amplifiers are applied to the output circuits 102 and 103 and controller 101 of the SLIC 100 of FIG. 4.

The operational amplifier OPAt is for the tip line, and the operational amplifier OPAr is for the ring line. On the tip line, an input voltage VINt is applied as an input IN3 to the operational amplifier OPAt, and the output OUT3 of the operational amplifier OPAt is supplied as an input IN1 to the output circuit AT (400) through a resistor R11 (R401). On the ring line, an input voltage VINr is applied as an input IN3 to the operational amplifier OPAr, and the output OUT3 of the operational amplifier OPAr is supplied as an input IN2 to the output circuit AR (400) through a resistor R13 (R401). The resistors R12 and R14 of FIGS. 4 and 26 correspond to the resistor R402 of FIG. 25, the resistors R22 and R24 correspond to the resistor R404, and the resistors RF1 and RF2 correspond to the resistor R405.

In the above embodiments, the npn-type transistors may be replaced with pnp-type transistors, and the pnp-type transistors may be replaced with npn-type transistors. The present invention may employ not only the bipolar transistors but also often semiconductor devices such as MOS transistors.

As explained above in detail, an output circuit according to the present invention employs external transistors in an output section and is capable of minimizing a fluctuation in an output idle current and improving the range of output voltages when there is a load current. An output-voltage-limiting operational amplifier according to the present invention carries out a feedback operation on an output section, to limit the output voltage without influencing an input voltage, or without changing the impedance of a high-impedance input.

Many different embodiments of the present invention may be constructed without departing from the spirit and scope of the present invention, and it should be understood that the present invention is not limited to the specific embodiments described in this specification, except as defined in the appended claims.

What is claimed is:

1. An output circuit having first and second transistors connected to first and second power source means and a plurality of diode means connected to a control terminal of said first transistor and a control terminal of said second transistor, wherein said output circuit comprises:

a third transistor having a first terminal connected to said second power source means and a second terminal connected to a predetermined position among said diode means, a predetermined voltage being applied from said diode means to the control terminal of said first transistor when said third transistor is saturated, to bring a level of an output of said output circuit close to a level of said second power source means, wherein said diode means comprises first and second diodes connected in series, and the second terminal of said third transistor is connected to a node between said first and second diodes.

2. The output circuit as claimed in claim 1, wherein said diode means comprises transistors forming a Darlington circuit.

3. The output circuit as claimed in claim 1, wherein at least one of said first and second transistors comprises a plurality of output transistors forming a Darlington circuit, and the number of said diode means is determined in accordance with an arrangement of said output transistors.

4. The output circuit as claimed in claim 1, therein said first transistor is an npn-type bipolar transistor, said second transistor is a pnp-type bipolar transistor, and a first terminal of each of said first and second transistors is an emitter.

5. The output circuit as claimed in claim 1, wherein said output circuit is applied to a power supply circuit of a subscriber line interface circuit of an exchange.

6. The output circuit as claimed in claim 19, wherein said output circuit further comprises a fourth transistor, a fifth transistor, a first resistor means, and a capacitor means, said fourth transistor having a control terminal connected to an output of a differential circuit, a first terminal connected to said second power source means through said first resistor means as well as to the control terminals of said third and fifth transistors, and a second terminal connected to said first power source means, said fifth transistor having a first terminal connected to said second power source means and a second terminal connected to the control terminal of said second transistor, said capacitor means being connected between the control terminal of said fourth transistor and the second terminal of said fifth transistor.

7. The output circuit as claimed in claim 6, wherein said differential circuit receives an input and an inverted input.

8. The output circuit as claimed in claim 6, wherein said output circuit further comprises a stabilizing diode means connected to the second terminals of said fifth and third transistors, so that a potential of the second terminal of said third transistor is not brought to be too low with respect to the potential of the second terminal of said fifth transistor.

9. The output circuit as claimed in claim 8, wherein said stabilizing diode means is a diode having an anode connected to the second terminal of said fifth transistor and a cathode connected to the second terminal of said third transistor.

10. The output circuit as claimed in claim 6, wherein said output circuit further comprises a second resistor means inserted between a node between the first terminal of said fourth transistor and said first resistor means and the control terminal of said fifth transistor.

11. The output circuit as claimed in claim 6, wherein said output circuit further comprises a second resistor means inserted between a node between the first terminal of said fourth transistor and said first resistor means and the control terminal of said third transistor.

12. An output circuit having first and second transistors connected to first and second power source means and a plurality of diode means connected to a control terminal of said first transistor and a control terminal of said second transistor, wherein said output circuit comprises:

a third transistor having a first terminal connected to said second power source means and a second terminal connected to a predetermined position among said diode means, a predetermined voltage being applied from said diode means to the control terminal of said first transistor when said third transistor is saturated, to bring a level of an output of said output circuit close to a level of said second power source means; and a fourth transistor, a fifth transistor, a first resistor means, and a capacitor means, said fourth transistor having a control terminal connected to an output of a differential circuit, a first terminal connected to said second power source means through said first resistor means as well as to the control terminals of said third and fifth transistors, and a second terminal connected to said first power source means, said fifth transistor having a first terminal connected to said second power source means and a second terminal connected to the control terminal of said second transistor, said capacitor means being connected between the control terminal of said fourth transistor and the second terminal of said fifth transistor.

13. The output circuit as claimed in claim 12, wherein said differential circuit receives an input and an inverted input.

14. The output circuit as claimed in claim 12, wherein said output circuit further comprises a stabilizing diode means connected to the second terminals of said fifth and third transistors, so that a potential of the second terminal of said third transistor is not brought to be too low with respect to the potential of the second terminal of said fifth transistor.

15. The output circuit as claimed in claim 14, wherein said stabilizing diode means is a diode having an anode connected to the second terminal of said fifth transistor and a cathode connected to the second terminal of said third transistor.

16. The output circuit as claimed in claim 12, wherein said output circuit further comprises a second resistor means inserted between a node between the first terminal of said fourth transistor and said first resistor means and the control terminal of said fifth transistor.

17. The output circuit as claimed in claim 12, wherein said output circuit further comprises a second resistor means inserted between a node between the first terminal of said fourth transistor and said first resistor means and the control terminal of said third transistor.

18. The output circuit as claimed in claim 12, wherein said diode means comprises transistors forming a Darlington circuit.

19. The output circuit as claimed in claim 12, wherein at least one of said first and second transistors comprises a plurality of output transistors forming a Darlington circuit and the number of said diode means is determined in accordance with an arrangement of said output transistors.

20. The output circuit as claimed in claim 12, wherein said first transistor is an npn-type bipolar transistor, said second transistor is a pnp-the bipolar transistor, and a first terminal of each of said first and second tansistors is an emitter.

21. The output circuit as claimed in claim 12, wherein said output circuit is applied to a power supply circuit of a subscriber line interface circuit of an exchange.

* * * * *